United States Patent [19]
Henley et al.

[11] Patent Number: 6,153,524
[45] Date of Patent: *Nov. 28, 2000

[54] CLUSTER TOOL METHOD USING PLASMA IMMERSION ION IMPLANTATION

[75] Inventors: Francois J. Henley, Los Gatos; Nathan Cheung, Albany, both of Calif.

[73] Assignee: Silicon Genesis Corporation, Campbell, Calif.

[*] Notice: This patent is subject to a terminal disclaimer.

[21] Appl. No.: 09/123,853

[22] Filed: Jul. 28, 1998

Related U.S. Application Data

[60] Provisional application No. 60/054,131, Jul. 29, 1997.

[51] Int. Cl.⁷ .................................................. H01L 21/302
[52] U.S. Cl. ........................ 438/691; 438/690; 438/692; 438/710; 438/712
[58] Field of Search ................... 438/692, 691, 438/712, 690, 710, 689

[56] References Cited

U.S. PATENT DOCUMENTS

| | | | |
|---|---|---|---|
| 4,746,394 | 5/1988 | Sueta et al. | 156/513 |
| 4,808,546 | 2/1989 | Moniwa et al. | 437/41 |
| 5,183,775 | 2/1993 | Levy | 437/60 |
| 5,196,355 | 3/1993 | Wittkower | 437/24 |
| 5,289,010 | 2/1994 | Shohet | 250/492.21 |
| 5,296,272 | 3/1994 | Matossian et al. | 427/523 |
| 5,305,221 | 4/1994 | Atherton | 364/468 |
| 5,311,028 | 5/1994 | Glavish | 250/492.21 |
| 5,342,652 | 8/1994 | Foster et al. | 427/253 |
| 5,354,381 | 10/1994 | Sheng | 118/723 |
| 5,380,682 | 1/1995 | Edwards et al. | 437/225 |
| 5,427,638 | 6/1995 | Goetz et al. | 156/153 |
| 5,436,175 | 7/1995 | Nakato et al. | 437/24 |
| 5,498,290 | 3/1996 | Matossian et al. | 118/723 |
| 5,525,159 | 6/1996 | Hama et al. | 118/723 |
| 5,554,249 | 9/1996 | Hasegawa | 156/345 |
| 5,554,853 | 9/1996 | Rose | 250/492.21 |
| 5,580,429 | 12/1996 | Chan et al. | 204/192.38 |
| 5,641,707 | 6/1997 | Moslehi | 438/513 |
| 5,661,043 | 8/1997 | Rissman et al. | 438/162 |
| 5,711,812 | 1/1998 | Chapek et al. | 118/723 |
| 5,822,172 | 10/1998 | White | 361/234 |
| 5,854,123 | 12/1998 | Sato et al. | 438/507 |
| 5,856,674 | 1/1999 | Kellerman | 250/423 |
| 5,965,034 | 10/1999 | Vinogradou et al. | 216/68 |
| 6,013,563 | 1/2000 | Henley et al. | 438/458 |

FOREIGN PATENT DOCUMENTS

| | | |
|---|---|---|
| 3-19218 | 1/1991 | Japan . |
| 3-268444 | 11/1991 | Japan . |
| WO 93/18201 | 9/1993 | WIPO . |

OTHER PUBLICATIONS

Low Energy Separation Implantation of Oxygen Strucuture via Plasma Source Ion Implantation, L. Zhang, et al Appl. Phys. Lett. 65 (8) Aug. 22, 1994.

*Primary Examiner*—Felisa Hitesha
*Assistant Examiner*—Vanessa Perez-Ramos
*Attorney, Agent, or Firm*—Townsend and Townsend and Crew LLP

[57] ABSTRACT

A cluster tool method using plasma immersion ion implantation chamber. In some embodiments, the cluster tool method also includes a controlled cleaving process chamber, as well as others.

73 Claims, 13 Drawing Sheets

CLUSTER TOOL METHOD USING PLASMA IMMERSION ION IMPLANTATION

CROSS-REFERENCE TO RELATED APPLICATIONS

The present patent application claims priority to U.S. Ser. No. 60/054,131 filed Jul. 29, 1997, in the name of Henley et al., and assigned to Silicon Genesis Corporation. The present application is also being filed concurrently with the two applications shown below.

1. U.S. patent application Ser. No. 09/124,161, in the name of Henley, et al., and assigned to Silicon Genesis Corporation;

2. U.S. patent application Ser. No. 09/124,156, in the name of Henley, et al., and assigned to Silicon Genesis Corporation The two applications, which do not include the present application, are hereby incorporated by reference. All three applications including the present application are being filed on the same date.

BACKGROUND OF THE INVENTION

The present invention relates to the manufacture of substrates. More particularly, the invention provides techniques including an apparatus for processing substrates using a cluster tool apparatus with plasma immersion ion implantation ("PIII"). The present cluster tool apparatus with PIII can be used for the manufacture of a variety of substrates such as a silicon-on-insulator substrates for semiconductor integrated circuits, for example. Additionally, the present cluster tool apparatus can be generally used for the manufacture of integrated circuits. But it will be recognized that the invention has a wider range of applicability; it can also be applied to other substrates for multi-layered integrated circuit devices, three-dimensional packaging of semiconductor devices, photonic devices, piezoelectronic devices, microelectromechanical systems ("MEMS"), sensors, actuators, epitaxial-like substrates using similar or dissimilar materials, solar cells, flat panel displays (e.g., LCD, AMLCD), biological and biomedical devices, and the like.

As device size becomes smaller and wafer size becomes larger, it has been desirable to fabricate integrated circuits on multi-layered substrates such as a silicon-on-insulator ("SOI") substrate or wafer, rather than conventional "bulk" silicon wafers. A variety of techniques have been proposed or used for fabricating the SOI wafer. These techniques include, among others, bonding a thick film of silicon material onto an insulating layer formed overlying a bulk substrate. The thick film of silicon material is commonly "thinned" by way of grinding and polishing techniques such as chemical mechanical planarization. Although this technique is fairly easy to useful in making an SOI wafer, the technique is extremely time consuming. Additionally, the technique is extremely expensive due to the use of the grinding or polishing technique, which often takes a long time and uses expensive processing chemicals. Grinding has also been shown to degrade device performance. Accordingly, an SOI wafer made by way of conventional bonding and grinding techniques are extremely costly and have numerous limitations.

A technique called "separation by implantation of oxygen," commonly termed SIMOX also has been proposed. A detailed description of this process is described in Stanley Wolf Ph.D., SILICON PROCESSING FOR THE VLSI ERA (Volume 2), pages 66–79, which is hereby incorporated by reference. This technique generally uses conventional beam-line ion implanters for introducing the oxygen into the silicon wafer. Unfortunately, the conventional SIMOX process generally produces a costly resulting SOI wafer. This cost often stems from the long time needed to implant a sufficient dose of oxygen into the silicon wafer. Since ion implanters commonly represent one of the largest capital cost items in a fabrication facility, it is often difficult to allocate the implanter for use in the conventional SIMOX process, which is often used for a variety of other integrated circuit processing operations. Additionally, many fabrication facilities (e.g., integrated circuit and wafer) simply cannot afford purchasing additional ion implantation equipment due to its excessive cost. Accordingly, silicon-on-insulator wafers made using the conventional SIMOX process are often costly and generally take a long time to fabricate.

From the above, it is seen that techniques for the manufacture of substrates that are cost effective and efficient are often desirable.

SUMMARY OF THE INVENTION

According to the present invention, a technique including a method for producing an SOI substrate is provided. More particularly, the invention provides a variety of techniques including a method and resulting devices for processing substrates using a cluster tool apparatus configured with a plasma immersion ion implantation system. The present cluster tool apparatus with PIII can be used for the manufacture of a variety of substrates such as a silicon-on-insulator substrate for semiconductor integrated circuits, for example. Additionally, the present cluster tool apparatus can generally be used for the manufacture of integrated circuits, as well as other devices.

In a specific embodiment, the present invention provides a method for processing substrates using a novel cluster tool apparatus. The method uses, among other elements, a transfer chamber comprising a robot therein. A plasma immersion ion implantation chamber is coupled to the transfer chamber, and a second chamber is coupled to the transfer chamber. The second chamber can be selected from at least a CVD chamber, vapor phase surface cleaning chamber, an etch chamber, a PVD chamber, a thermal annealing chamber, a bonding chamber, a CMP chamber, a thermal treatment chamber, a plasma treatment chamber, an epitaxial silicon (or other material) deposition chamber, and others. The present apparatus can process a plurality of substrates without breaking vacuum, which enhances process quality and device yields, among other factors.

In an alternative specific embodiment, the present invention provides a technique for forming silicon-on-insulator substrate using a novel chamber configuration, as well as other features The method uses a step of providing a donor substrate, e.g., silicon wafer. The donor substrate is placed in a first chamber such as a PIII chamber, where particles are introduced through a surface of the donor substrate to a selected depth underneath the surface by way of ion implantation or material to be removed above the selected depth. Next, the donor substrate is placed a second chamber (which can also be the same as the first chamber). In the second chamber, which is a bonding chamber, the donor substrate is bonded to a receptor or target substrate to form a multi-layered substrate. The multi-layered substrate is placed in a third chamber such as a CCP chamber, where energy is provided to a selected region of the substrate to initiate a controlled cleaving action at the selected depth in the substrate, whereupon the cleaving action is made using a propagating cleave front to free a portion of the substrate material to be removed from the substrate. In preferred embodiments, a plasma cleaning step of surfaces of the donor and receptor substrates is performed before bonding to enhance the bonding process. In some embodiments, the donor substrate is recycled to save costs in manufacturing, for example. Here, the recycled donor substrate is used again as material.

Numerous benefits are achieved over pre-existing techniques using the present invention. In particular, the present invention provides a single solution or apparatus to form, for example, SOI wafers in a single (or multiple) cluster tool apparatus. Additionally, the present invention uses a novel cleaning and bonding technique which can occur in a chamber design without being exposed to ambient conditions, thereby preventing particulate contamination of the bonded substrates, for example. The present invention also provides an epitaxial chamber or molecular beam epitaxy ("MBE") for growing films from a "seed" layer on a lattice mismatched substrate, for example. Furthermore, the present invention uses a high throughput PIII tool coupled in a cluster tool arrangement to enhance substrate throughput, which reduces the overall costs associated with fabrication of substrates such as SOI wafers and the like. These and other benefits are described throughout the specification.

The present invention achieves these benefits and others in the context of known process technology. However, a further understanding of the nature and advantages of the present invention may be realized by reference to the latter portions of the specification and attached drawings.

DESCRIPTION OF THE SPECIFIC EMBODIMENT

The present invention provides a technique for manufacturing a substrate using a high capacity PIII tool configured in a cluster tool arrangement. More particularly, the present invention provides a single (or multiple) tool(s), which is capable of manufacturing silicon-on-insulator substrates. Since most of the manufacturing steps occur on a single tool, substrate fabrication is more cost effective and is also prone to less particulate contamination or the like. Specific details regarding the present invention are described below in the following sections. For easy reading, the sections have been categorized as: (1) Cluster Tool Using PIII; and (2) Silicon On Insulator Substrate.

1. Cluster Tool Using PIII

Figure 1:
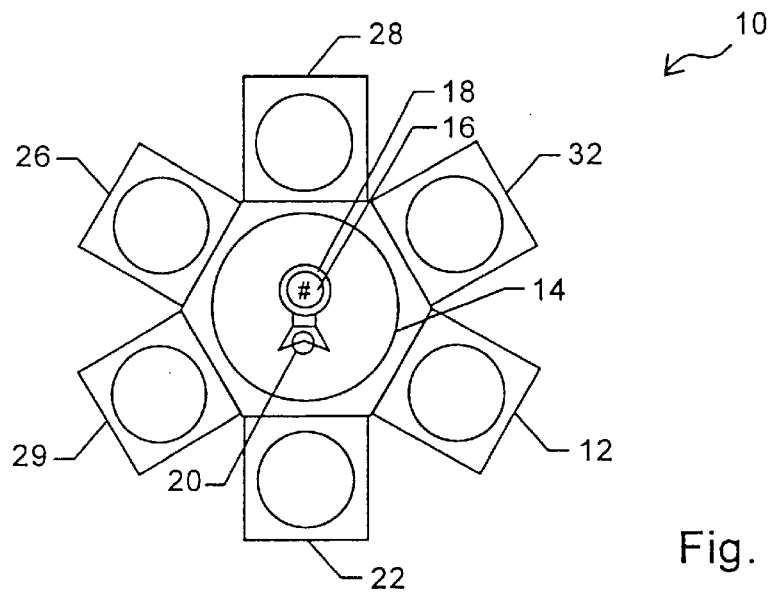
FIGS. 1–3 are simplified diagrams illustrating an apparatus using PIII according to embodiments of the present invention.

FIG. 1 is a simplified diagram of a cluster tool 10 using PIII according to the present invention. This diagram is merely an illustration and should not limit the scope of the claims herein. One of ordinary skill in the art would recognize other variations, modifications, and alternatives. The cluster tool 10 is configured in a circular or round annular configuration. That is, transfer chamber 14, including a robot 20, is placed in a center region, which is surrounded by a plurality of chambers, shown by at least reference numerals 12, 22, 24, 26, 28, and 32. Accordingly, robot 20 can insert and remove a wafer 16 or wafers from any one of the chambers according to a desired application. Robot 20 includes a wafer handler 18, which holds the wafer 16.

Depending upon the application, the chambers are selected for the particular process recipe. More particular, the present cluster tool uses a novel arrangement of chambers including a plasma immersion implantation chamber 12, a controlled cleaving process chamber 22, a plasma clean chamber 24, and a bonding chamber 26, which can be used in combination to form, for example, an SOI wafer, as well as other substrates and integrated circuits. Cluster tool 10 also includes an input/output chamber 28, which is used for loading an in-process wafer, and unloading a processed wafer. Additional chamber 32 can perform a variety of other processes such as thermal treatment, chemical vapor deposition ("CVD"), physical vapor deposition ("PVD"), plasma or reactive ion etching, and others. Of course, the exact configuration of chambers used in the present cluster tool apparatus depends upon the application.

Figure 2:
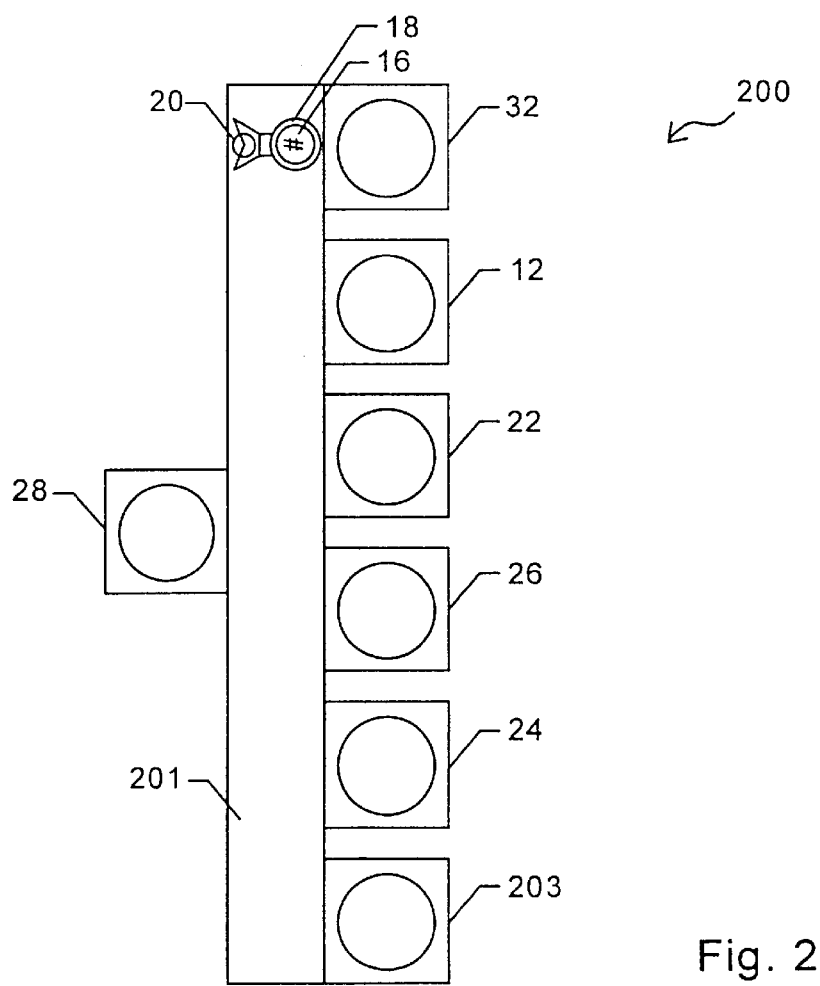

FIG. 2 is a simplified diagram of a cluster tool 200 using PIII according to an alternative embodiment of the present invention. This diagram is merely an illustration and should not limit the scope of the claims herein. One of ordinary skill in the art would recognize other variations, modifications, and alternatives. For cross-referencing purposes, some of the reference numerals in FIG. 1 are similar to those shown in FIG. 2. The cluster tool 200 is configured in an inline or linear configuration. That is, transfer chamber 201, including a robot 20, is placed in parallel alignment with a plurality of chambers, shown by reference numerals 12, 22, 24, 26, 28, 32, and 203. Accordingly, robot 20 can insert and remove a wafer 16 or wafers, which rests on handler 18, from any one of the chambers according to the desired application.

Depending upon the application, the chambers are selected for the particular process recipe. More particular, the present cluster tool uses an alternative novel arrangement of chambers including the PIII chamber 12, the CCP chamber 22, the plasma clean chamber 24, and the bonding chamber 26, which can be used in combination to form, for example, an SOI wafer, as well as other substrates and integrated circuits. Cluster tool 200 also includes the input/output chamber 28, which is used for loading an in-process wafer, and unloading a processed wafer, which is centrally located on the opposite side of the other chambers. Additional chambers 32 and 203 can perform a variety of processes such as thermal treatment, CVD, PVD, plasma or reactive ion etching, and others. Of course, the exact configuration of chambers used in the present cluster tool depends upon the application.

Figure 3:
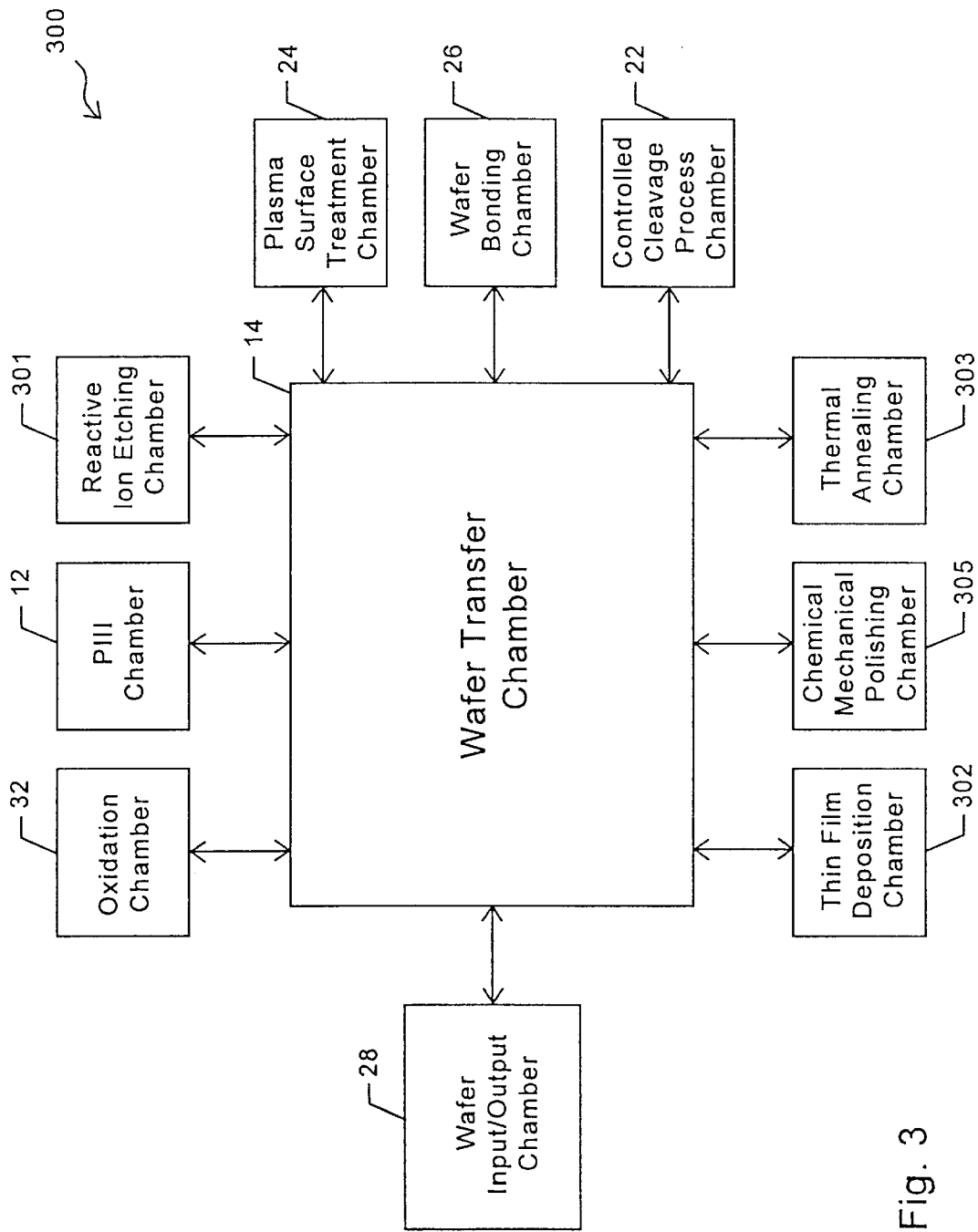

FIG. 3 is a simplified diagram of a cluster tool 300 using PIII according to still an alternative embodiment of the present invention. This diagram is merely an illustration and should not limit the scope of the claims herein. One of ordinary skill in the art would recognize other variations, modifications, and alternatives. The cluster tool 300 is made to manufacture an SOI wafer, for example. For cross-referencing purposes, some of the reference numerals in the previous FIGS. are similar to those shown in FIG. 3. The cluster tool 300 is configured in a round or circular arrangement, but can also be in an in-line or linear configuration.

In this present embodiment, the chambers are selected for the particular process recipe to form, for example, an SOI wafer. More particular, the present cluster tool uses the PIII chamber 12, the CCP chamber 22, the plasma clean chamber 24, and the bonding chamber 26. Cluster tool 300 also includes the input/output chamber 28, which is used for loading an in-process wafer, and unloading a processed wafer. Additional chambers including chambers for thermal treatment 303, CVD or PVD 307, plasma or reactive ion etching 301, and others.

Each of the cluster tools is coupled to power sources, vacuum pumps, and chemical sources for the desired application. In preferred embodiments, the vacuum pumps are used to place the entire cluster tool, including chambers, in a vacuum. A power source is used to provide an RF potential for supplying energy to a plasma. Each cluster tool also includes a main control panel, which is used to control and program recipes. More particularly, a recipe is placed in memory and is controlled using micro-processor-type computer architecture. A variety of recipes in the form of computer software or programs can be stored and used according to the present invention. These and other features are will be described throughout the present specification, and more particularly below.

Although the above cluster tool is shown using a certain number of chambers and types of chambers, it is possible to use any number of chambers and even different types, if desired. For example, the number of chambers can be reduced to six or less, and even four or less. Additionally, chambers for CVD, PVD, and etching may not be used, depending upon the application. Depending upon the process, it may be desirable to only include the PIII chamber and the bonding chamber, for example. Of course, the type of chambers used and their configuration will depend upon the application. Some details, however, of each chamber are given as shown.

A. Plasma Immersion Ion Implantation ("PIII") Chamber

Figure 4:
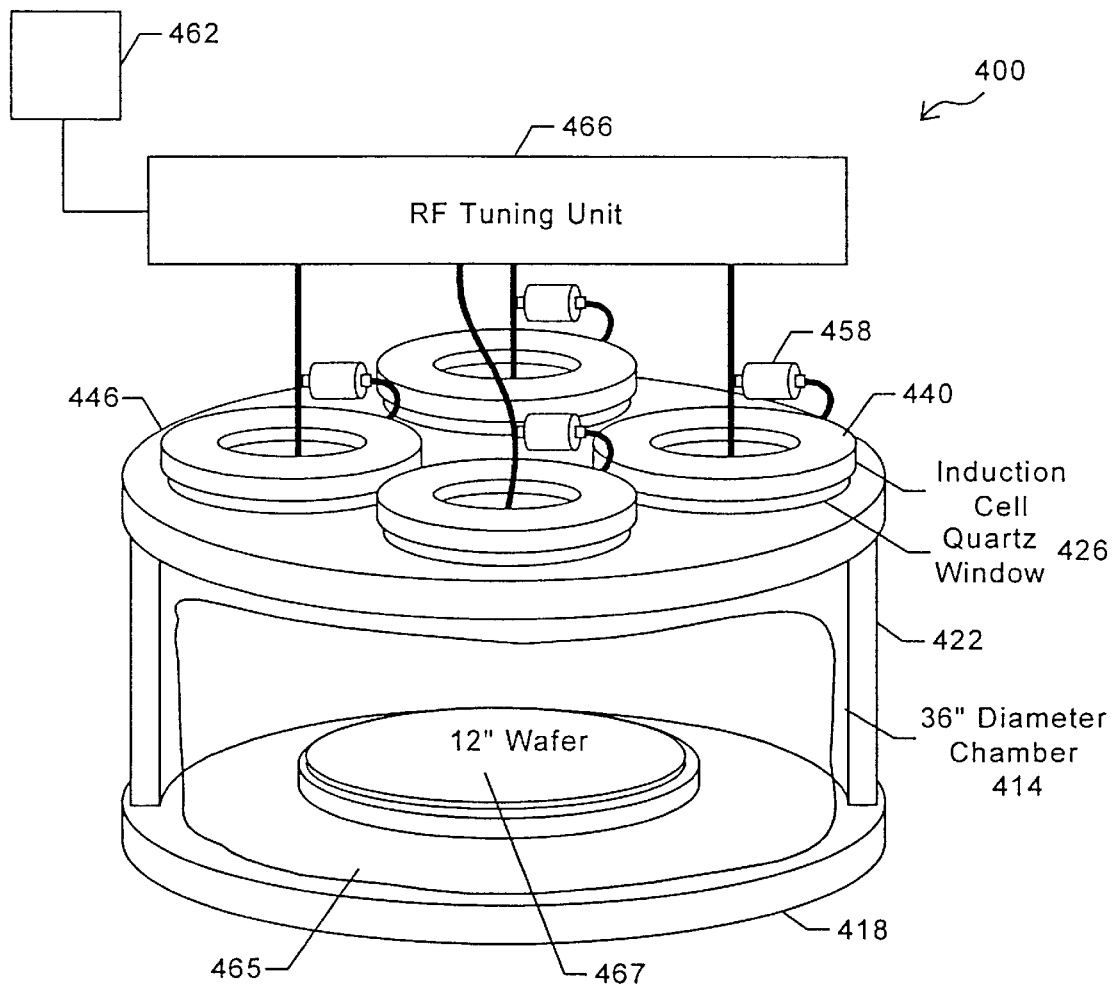
FIGS. 4–5 are simplified diagrams of PIII chambers according to embodiments of the present invention.

A PIII chamber is an assembly where a plasma immersion ion implantation process occurs. As merely an example, FIG. 4 is a simplified diagram of a PIII system 400 according to the present invention, which can be incorporated into the cluster tool. The PIII system 400 includes a vacuum chamber 414 having a vacuum port 418 connected to a vacuum pump (not shown). The system 400 includes a series of dielectric windows 426 vacuum sealed by o-rings and attached by removable clamps to the upper surface 422 of the vacuum chamber 414. Removably attached to some of these dielectric windows 426 are rf plasma sources 440, in a system having a helical or pancake antennae 446 located within an outer shield/ground. Cooling of each antenna is accomplished by passing a cooling fluid through the antenna. Cooling is typically required only at higher power. The windows 426 without attached rf plasma sources 440 are usable as viewing ports into the chamber 414. The removability of each plasma source 440 permits the associated dielectric window 426 to be cleaned or the plasma source 440 replaced without the vacuum within the system being removed. Although glass windows are used, other dielectric material such as quartz or polyethylene may be used for the window material.

Each antenna 446 is connected to an rf generator 466 through a matching network, through a coupling capacitor. Each antenna 446 also includes a tuning capacitor 458 connected in parallel with its respective antenna 446. Each of the tuning capacitors 458 is controlled by a signal from a controller 462. By individually adjusting the tuning capacitors 485, the output power from each rf antenna 446 can be adjusted to maintain the uniformity of the plasma generated. Other tuning means such as zero reflective power tuning may also be used to adjust the power to the antennae. The rf generator 466 is controlled by a signal E from the controller 462. The controller 462 controls the power to the antennae 446 by a signal F to the matching network. The system also has a susceptor 465, which holds a wafer 467. The susceptor can also hold other substrate materials.

As merely an example, a PIII chamber is described in for example PCT Application No. PCT/US96/11213, in the name of Chung Chan, which is incorporated by reference for all purposes. The PCT application generally describes a non-mass separating technique using PIII, where the PIII apparatus includes multiple sources. The multiple sources are used to improve implantation uniformity and also reduces costs, when compared with conventional beam-line implantation. Additionally, the present PIII chamber can be replaced by any non-mass separated technique such as ion shower or the like.

Figure 5:
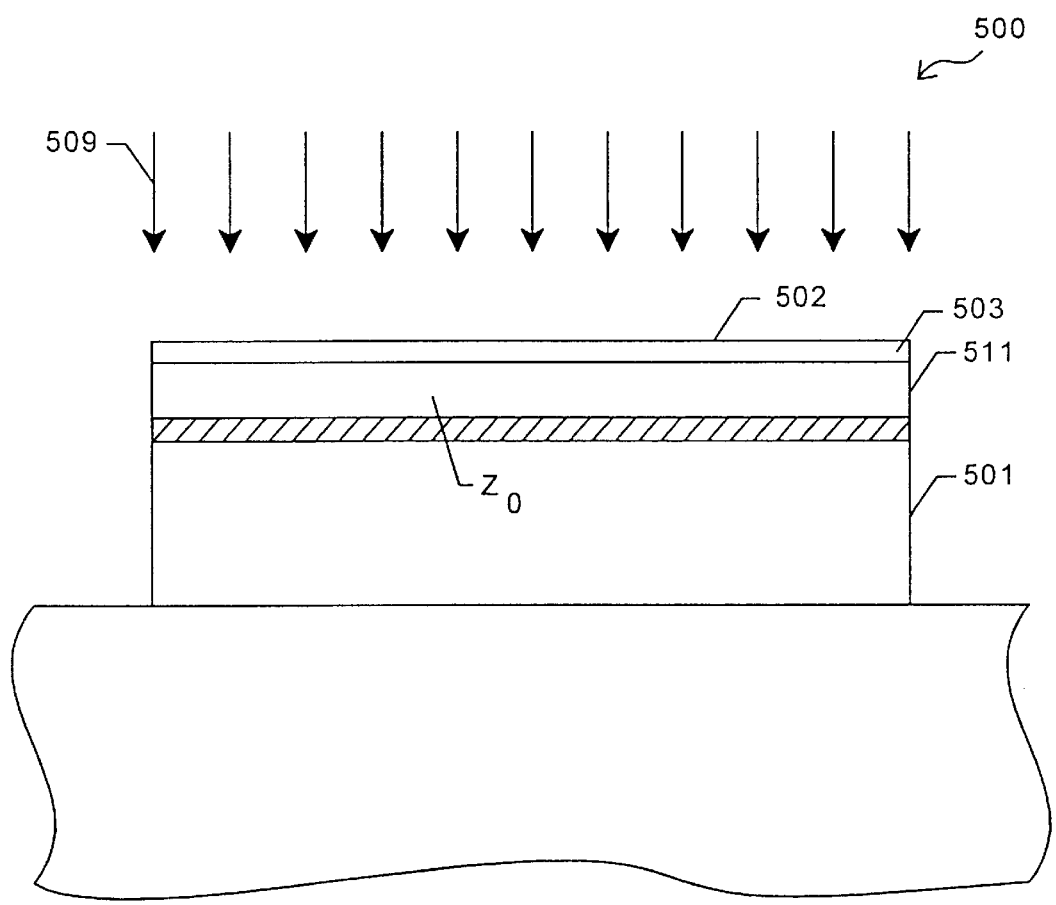

In a specific embodiment, the present PIII chamber performs a variety of processing techniques. An example of a PIII process is shown in the simplified cross sectional view diagram 500 of FIG. 5. This diagram is merely an illustration and should not limit the scope of the claims herein. One of ordinary skill in the art would recognize other variations, modifications, and alternatives. In a PIII chamber, selected energetic particles 509 implant through the top surface 502 of the silicon wafer 501 to a selected depth, which defines the thickness of the material region 503, termed the thin film of material. As shown, the particles have a desired concentration 511 at the selected depth ($z_0$). Alternatively, the particles can be distributed through the silicon wafer, for example. Still further, the particles can have a specific concentration used for doping purposes.

Depending upon the application, a variety of particles can be used. In a layer transfer process, for example, smaller mass particles are generally selected to reduce a possibility of damage to the material region. That is, smaller mass particles easily travel through the substrate material to the selected depth without substantially damaging the material region that the particles traversed through. For example, the smaller mass particles (or energetic particles) can be almost any charged (e.g., positive or negative) and/or neutral atoms or molecules, or electrons, or the like. In a specific embodiment, the particles can be neutral and/or charged particles including ions of hydrogen and its isotopes, rare gas ions such as helium and its isotopes, and neon. The particles can also be derived from compounds such as gases, e.g., hydrogen gas, water vapor, methane, and other hydrogen compounds, and other light atomic mass particles. Alternatively, the particles can be any combination of the above particles, and/or ions and/or molecular species and/or atomic species. In other embodiments, such as doping, the particles are generally ionic species such as a boron bearing particle, a phosphorous bearing particle, arsenic bearing particle, and others. In still further embodiments, an insulating material can be formed by way of implanting oxygen, nitrogen, water, and other species. Other non-mass separated techniques such as ion shower or the like also can be used. Of course, techniques used depend upon the application.

B. Controlled Cleaving Process ("CCP") Chamber

A CCP chamber is an assembly where a controlled cleaving process occurs. The CCP process separates a film of material from a bulk substrate in a controlled manner. That is, energy used to detach or separate the film is not excessive, thereby forming a substantially smooth and uniform detached film. This process occurs in an assembly, which can provide the energy (or stress) to detach the film of material from the bulk substrate. Details of the CCP process are illustrated in Provisional Application Ser. No. 60/046,276 in the name of Henley et al. ("Henley et al.), and hereby incorporated by reference for all purposes.

Figure 6:
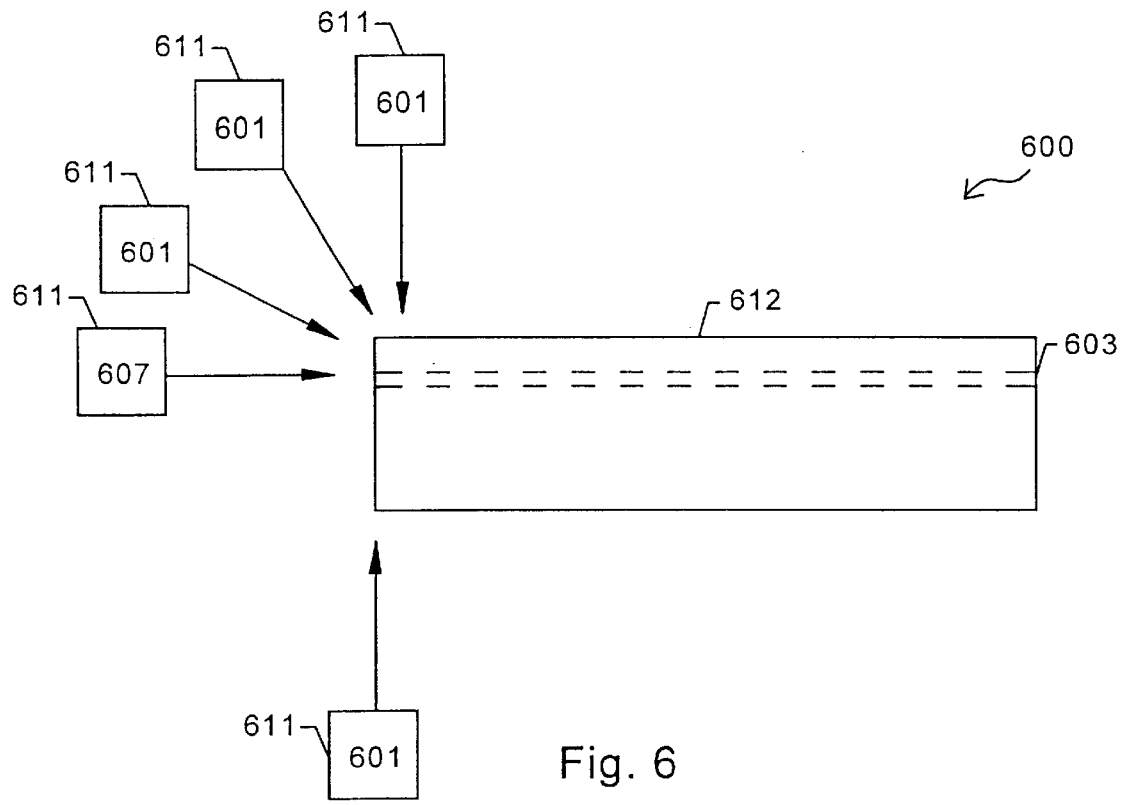
FIGS. 6–8 are simplified diagrams of CCP chamber processes according to embodiments of the present invention

In a specific embodiment, the CCP chamber uses controlled energy to detach or separate a portion of a film from a bulk substrate. FIGS. 6–9 are simplified diagrams of CCP chambers according to embodiments of the present invention. These diagrams are merely illustrations and should not limit the scope of the claims herein. One of ordinary skill in the art would recognize other variations, modifications, and alternatives. To demonstrate operation of the present chamber, a simplified cross-sectional view of an implanted substrate 600 using selective positioning of cleave energy is shown in FIG. 6, for example. The implanted wafer undergoes a step of selective energy placement 601 or positioning or targeting which provides a controlled cleaving action of the material region 612 at the selected depth 603. In preferred embodiments, selected energy placement 607 occurs near an edge or corner region of the selected depth 603 of the substrate.

The impulse (or impulses) is provided using energy sources 611, which are positioned proximate to the substrate. Examples of sources include, among others, a chemical source, a mechanical source, an electrical source, and a thermal sink or source. The chemical source can include a variety such as particles, fluids, gases, or liquids. These chemical sources can also include chemical reaction to increase stress in the material region. The chemical source is introduced as flood, time-varying, spatially varying, or continuous. In other embodiments, a mechanical source is derived from rotational, transnational, compressional, expansional, or ultrasonic energies. The mechanical source can be introduced as flood, time-varying, spatially varying, or continuous. In further embodiments, the electrical source is selected from an applied voltage or an applied electromagnetic field, which is introduced as flood, time-varying, spatially varying, or continuous. In still further embodiments, the thermal source or sink is selected from radiation, convection, or conduction. This thermal source can be selected from, among others, a photon beam, a fluid jet, a liquid jet, a gas jet, an electro/magnetic field, an electron beam, a thermoelectric heating, a furnace, and the like. The thermal sink can be selected from a fluid jet, a liquid jet, a gas jet, a cryogenic fluid, a super-cooled liquid, a thermoelectric cooling means, an electromagnetic field, and others. Similar to the previous embodiments, the thermal source is applied as flood, time-varying, spatially varying, or continuous. Still further, any of the above embodiments can be combined or even separated, depending upon the application. Depending upon the type of source, the source is selectively placed in the chamber or outside the chamber to desirably direct controlled energy toward the substrate. In some embodiments, the energy also is controlled in a spatial manner toward the substrate as well as an absolute manner. In further embodiments, a single pulse is sufficient to free a film of material from the substrate. Of course, the type of source used depends upon the application.

Figure 7:
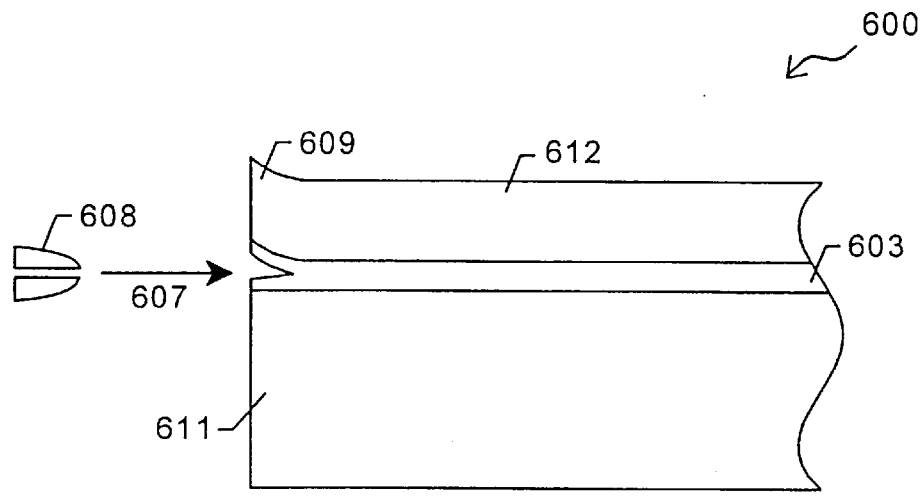

In a specific embodiment, the energy source can be a fluid jet that is pressurized (e.g., compressional) according to an embodiment of the present invention. FIG. 7 shows a simplified cross-sectional view diagram of a fluid jet from a fluid nozzle 608 used to perform the controlled cleaving process according to an embodiment of the present invention. The fluid jet 607 (or liquid jet or gas jet) impinges on an edge region of the substrate to initiate the controlled cleaving process. The fluid jet from a compressed or pressurized fluid source is directed to a region at the selected depth 603 to cleave a thickness of material region 612 from the substrate using force, e.g., mechanical, chemical, thermal. As shown, the fluid jet separates the substrate into two regions, including region 609 and region 611 that separate from each other at selected depth 603. The fluid jet can also be adjusted to initiate and maintain the controlled cleaving process to separate material 612 from substrate 600. Depending upon the application, the fluid jet can be adjusted in direction, location, and magnitude to achieve the desired controlled cleaving process. The fluid jet can be a liquid jet or a gas jet or a combination of liquid and gas. Additionally, the fluid jet can be multiple fluid jet sources that are positioned spatially around a periphery of the substrate. The multiple fluid jet sources can be pulsed in a selected manner to remove the thickness of material in a controlled manner.

Figure 8:
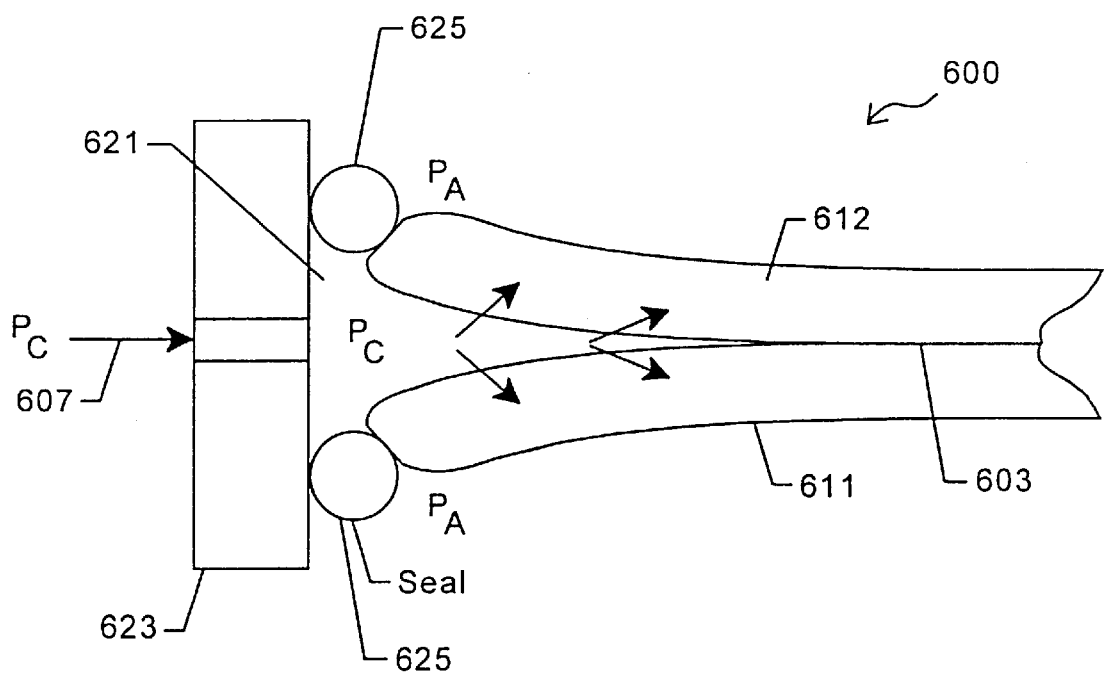

In a preferred embodiment, the energy source can be a compressional source such as, for example, compressed fluid that is static. FIG. 8 shows a simplified cross-sectional view diagram of a compressed fluid source 607 according to an embodiment of the present invention. The compressed fluid source 607 (e.g., pressurized liquid, pressurized gas) is applied to a sealed chamber 621, which surrounds a periphery or edge of the substrate 600. As shown, the chamber is enclosed by device 623, which is sealed by, for example, o-rings 625 or the like, and which surrounds the outer edge of the substrate. The chamber has a pressure maintained at $P_C$ that is applied to the edge region of substrate 600 to initiate the controlled cleaving process at the selected depth of implanted material. The outer surface or face of the substrate is maintained at pressure $P_A$ which can be ambient pressure e.g., 1 atmosphere or less. A pressure differential exists between the pressure in the chamber, which is higher, and the ambient pressure. The pressure difference applies force to the implanted region at the selected depth 603. The implanted region at the selected depth is structurally weaker than surrounding regions, including any bonded regions. Force is applied via the pressure differential until the controlled cleaving process is initiated. The controlled cleaving process separates the thickness of material 609 from substrate material 611 to split the thickness of material from the substrate material at the selected depth. Additionally, pressure $P_C$ forces material region 612 to separate by a "prying action" from substrate material 611. During the cleaving process, the pressure in the chamber can also be adjusted to initiate and maintain the controlled cleaving process to separate material 612 from substrate 600. Depending upon the application, the pressure can be adjusted in magnitude to achieve the desired controlled cleaving process. The fluid pressure can be derived from a liquid or a gas or a combination of liquid and gas. Additionally, the fluid jet can be multiple fluid jet sources that are positioned spatially around a periphery of the substrate. The multiple fluid jet sources can be pulsed in a selected manner to remove the thickness of material in a controlled manner.

Figure 9:
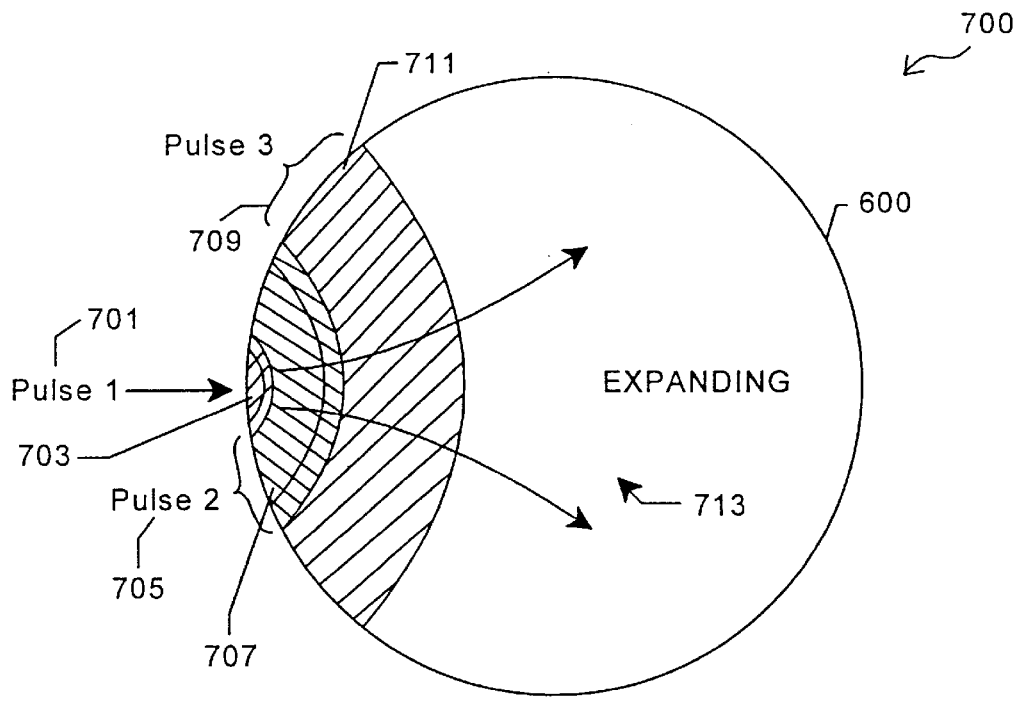
FIGS. 9–15 are simplified diagrams of other chamber processes according to embodiments of the present invention.

In a specific embodiment, the present invention provides a controlled-propagating cleave using a plurality of energy sources. The controlled-propagating cleave uses multiple successive impulses to initiate and perhaps propagate a cleaving process 700, as illustrated by FIG. 9. This diagram is merely an illustration, and should not limit the scope of the claims herein. As shown, the impulse is directed at an edge of the substrate, which propagates a cleave front toward the center of the substrate to remove the material layer from the substrate. In this embodiment, a source applies multiple pulses (i.e., pulse 1, 2, and 3) successively to the substrate. Pulse 1 701 is directed to an edge 703 of the substrate to initiate the cleave action. Pulse 2 705 is also directed at the edge 707 on one side of pulse 1 to expand the cleave front. Pulse 3 709 is directed to an opposite edge 711 of pulse 1 along the expanding cleave front to further remove the material layer from the substrate. The combination of these impulses or pulses provides a controlled cleaving action 713 of the material layer from the substrate.

The embodiments shown above describe some examples of CCP chamber processes. These CCP chambers make be implemented using a variety of hardware and/or software techniques. Accordingly, the present embodiments should not be construed as limiting the scope of the claims herein. One of ordinary skill in the art would recognize other variations, modifications, and alternatives.

C. Bonding Chamber

A bonding chamber is an assembly where donor and receptor wafers are bonded to form a multi-layered substrate structure. The bonding chamber can use a variety of technology to temporarily or permanently bond the donor and receptor wafers together. Some techniques for bonding wafers are described in Henley et al., but are not limited. Bonding wafers is also described throughout this specification, and most notably below.

Figure 10:
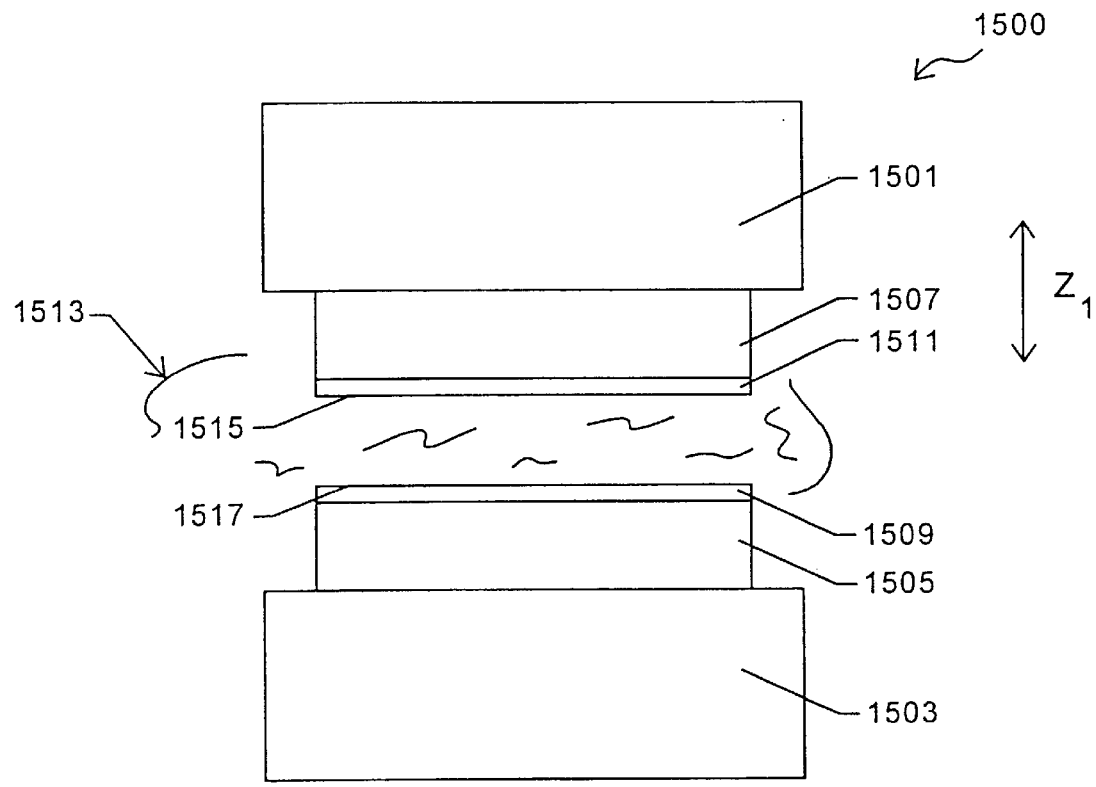

FIGS. 10–15 are simplified diagrams of a technique that can be performed in the present bonding chamber according to the present invention. These FIGS. are merely illustrations and should not limit the scope of the claims herein. FIG. 10 shows a lower susceptor 1503 and upper susceptor 1501. Upper susceptor is, for example, a movable electrostatic chuck, which can move in the positive and negative z-direction, as shown. An example of a process occurs by a robot placing the receptor substrate on the lower susceptor. The upper susceptor moves in a downwardly direction (e.g., negative z-direction) and picks up the receptor substrate 1507 and moves it upwardly to the position shown. The receptor substrate 1507 has a film of oxide 1511 thereon having a surface 1515. The robot then places a donor substrate 1505 on the lower susceptor. The donor substrate 1505 includes a film of oxide 1509 having surface 1517. Before clamping the two surfaces 1515 and 1517 together, a plasma clean 1513 operation is performed to activate the surfaces. The plasma clean process can use a variety of cleaning plasmas such as an oxygen bearing plasma, argon bearing plasmas, and others. Additional ways of dry cleaning such as cryogenic cleaning using carbon dioxide or hydrogen gases and others also can be used. The plasma clean process improves the subsequent bonding process.

Figure 11:
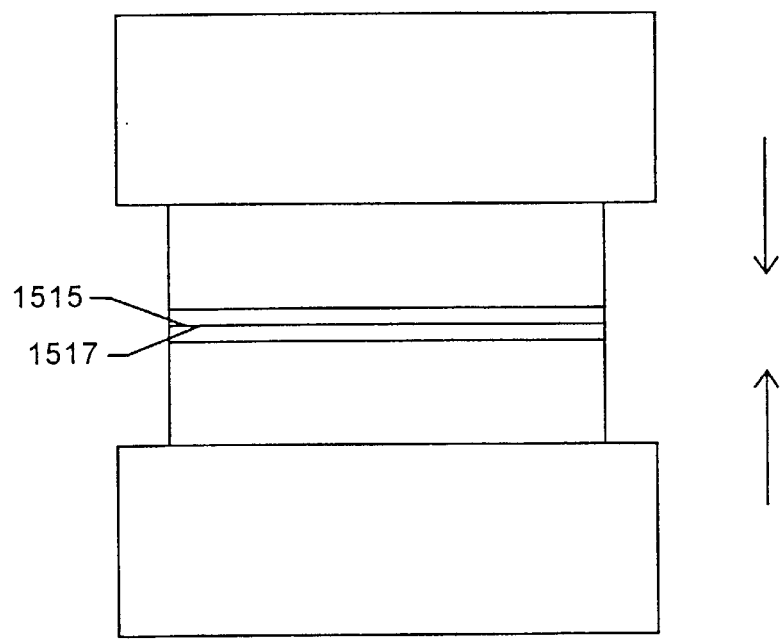
Figure 12:
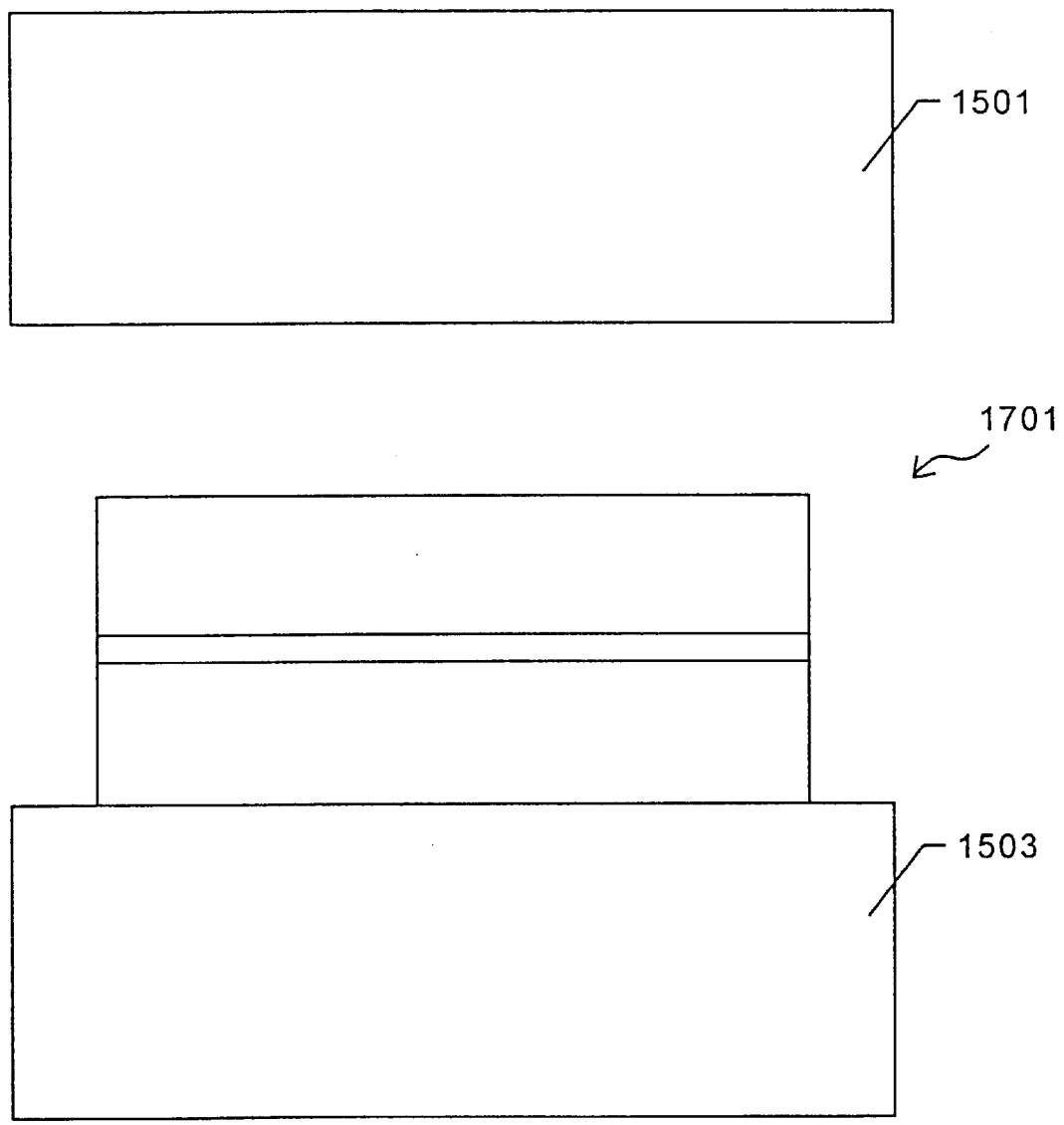

The upper and lower susceptors are then brought together to bring the surfaces of the substrates together, as shown in FIG. 11, for example. As shown, surface 1515 is in contact with surface 1517. Mechanical force or electro-static force is placed between these two surfaces to create a permanent or temporary bond between the donor substrate and the receptor substrate. After the two substrates are bonded together, the upper susceptor releases the receptor substrate to leave a bonded multilayered substrate 1701 on the lower substrate, as shown in FIG. 12. The robot in the cluster tool can then pick up the bonded multilayered substrate for further processing, if desired.

Figure 13:
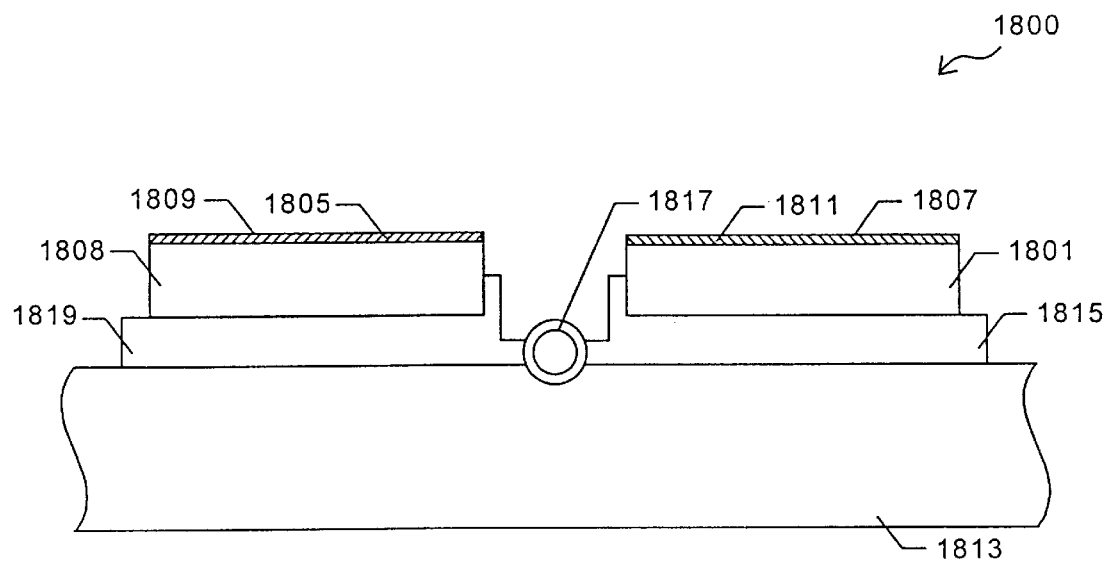
Figure 14:
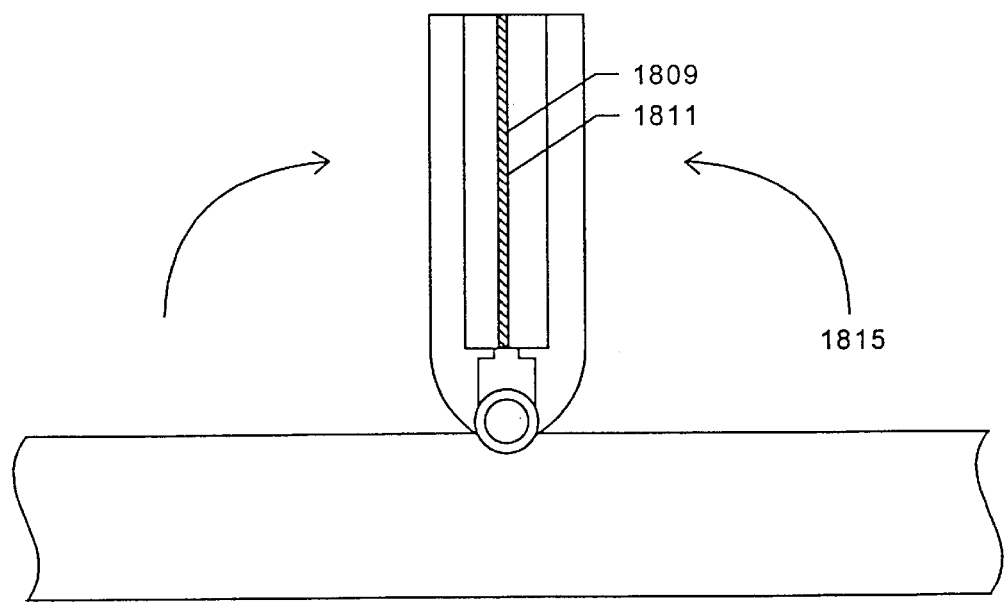
Figure 15:
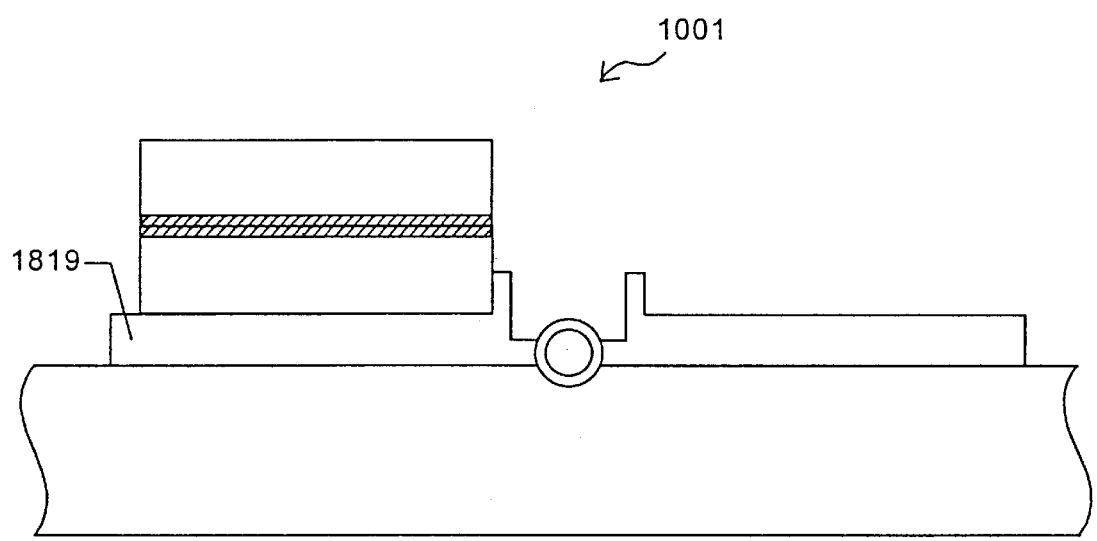

FIGS. 13–15 are simplified diagrams of an alternative bonding technique that can occur in the present bonding chamber. These FIGS. are merely illustrations and should not limit the scope of the claims herein. FIG. 13 is a simplified diagram of a bonding chamber 1800 including a base 1813, a first substrate site 1815, and a second substrate site 1819. First substrate site 1819 includes a donor substrate 1803, which has a film of oxide 1805 thereon having surface 1809. Second substrate site 1815 includes a receptor substrate 1801, which has a film of oxide 1807 thereon having surface 1811. These sites are coupled to each other by way of a rotatable device 1817 or "hinge," and operates in a "clam shell" like manner. Similar to the previous embodiment, a plasma cleaning process can clean surfaces 1811, 1809 in this present chamber.

To bond the surfaces of the substrates together, the two sites move toward each other as shown by the arrows in FIG. 14, for example. The two surfaces 1809, 1811 come in contact with each other, as shown. Mechanical force or electrostatic force is placed between these two surfaces to create a permanent or temporary bond between the donor substrate and the receptor substrate. After the two substrates are bonded together, site 1815 releases substrate 1801 and the two sites move back down toward the base, as shown in FIG. 15, for example. As shown is a bonded multilayered substrate 1001 on the first substrate site 1819. The robot in the cluster tool can then pick up the bonded multilayered substrate for further processing, if desired.

The above processes are merely examples. Other variations, modifications, and alternatives can be performed. Additional bonding techniques can also be used. These bonding techniques include, among others, thermal bonding, anodic bonding, chemical bonding, and plasma enhanced bonding. Of course, the type of technique used depends upon the application.

D. Plasma Clean Chamber

A plasma clean chamber is an assembly where a plasma cleaning process occurs. This chamber can be any plasma chamber capable of performing a plasma clean or strip process, such as those described below. In a specific embodiment, the plasma clean occurs in a chamber for bonding receptor and donor wafers together to maintain cleanliness of the bonding process, which should enhance bonding performance. The cleaning chamber can produce either a neutral or charged plasma for performing a selective cleaning process. The present cleaning chamber also enhances the PIII process. Here, the PIII process occurs on a substantially clean surface which tends to reduce implantation non-uniformities and the like. Any conventional cleaning chamber can be used, as well as others.

E. Thermal Treatment Chamber

A thermal treatment chamber is an assembly where thermal treatment (e.g., oxidation) occurs. The thermal treatment chamber can be a variety commonly known and used. For example, the thermal treatment chamber can be a diffusion chamber, a rapid thermal anneal chamber, or any other chamber. This chamber is capable of oxidizing or heating a surface of a silicon substrate, for example. Any conventional thermal treatment chamber can be used.

F. Thermal Annealing Chamber

A thermal annealing chamber is an assembly where thermal annealing of a wafer(s) or a film(s) occurs. The thermal annealing chamber can be a variety commonly known and used. For example, the thermal treatment chamber can be a diffusion chamber, a rapid thermal anneal chamber, or any other chamber. This chamber is capable of annealing damage in a silicon substrate, for example. The thermal anneal chamber can also drive in impurities. A beta annealing step can also be performed after a PIII step. Other processes also can be performed.

G. Chemical Vapor Deposition ("CVD") Chamber

The CVD chamber is an assembly where a deposition process occurs. Multiple CVD chambers can be configured around and attached to the transfer chamber. In most cases, the CVD chamber is sealed from the environment to preserve processing conditions in the chamber, but can also be exposed to the environment. The CVD chamber can be used to deposit a variety of films such as semiconductor films, conductive films, and dielectric films.

H. Physical Vapor Deposition ("PVD") Chamber

The PVD chamber is an assembly where a sputter deposition process occurs. Multiple PVD chambers can be configured around and attached to the transfer chamber. The PVD chamber can deposit a variety of metals such as tungsten, titanium, titanium nitride, copper, aluminum, and others. The PVD chamber used depends upon the application.

I. Plasma Etching Chamber

The plasma etching chamber is an assembly where a reactive ion etching process occurs. The plasma etching chamber can have one of many designs such as ECR, TCP, ICP, DPS, helicon, and others. The etching chamber can etch a metal layer, a polysilicon layer, or a dielectric layer. The etching chamber used depends upon the application.

J. Input/Output Chamber

The input/output chamber is an assembly where the wafers are input into the cluster tool for processing and wafers are output out of the transfer chamber when processing is completed. The input/output chamber is generally attached to the transfer chamber for providing a wafer to and from the transfer chamber. Transfer chambers are commonly used in cluster tool products such as those made by Applied Materials, Eaton, and other companies.

K. Epitaxial Deposition Chamber

The epitaxial deposition chamber is an assembly where an epitaxial layer such as single crystal silicon is formed by deposition on the wafer. The deposition chamber generally uses a technique commonly called chemical vapor deposition of epitaxial silicon. The silicon can be deposited on similar or dissimilar materials. The deposition chamber can be one selected from machine vendors such as Applied Materials of Santa Clara, California or ASM of Phoenix, Ariz. The present cluster tool can be combined with such deposition chamber in one or more embodiments.

2. Silicon On Insulator Substrate

A process for fabricating a silicon-on-insulator substrate according to the present invention may be briefly outlined as follows:

1. Provide a donor substrate in the cluster tool;
2. Place donor substrate into a thermal treatment furnace chamber;
3. Form oxide layer overlying surface of donor substrate;
4. Move donor substrate into PIII chamber;
5. Introduce particles into the donor substrate to a selected depth to define a thickness of film in the PIII chamber;
6. Provide a receptor substrate into the cluster tool;
7. Place receptor substrate into a thermal treatment furnace chamber;
8. Form oxide layer overlying surface of receptor substrate;
9. Place donor and receptor substrates having oxide layers into a cleaning chamber
10. Perform plasma cleaning of each substrate, together or separately;
11. Place substrates into bonding chamber;
12. Bond the donor substrate to the receptor substrate by joining the implanted face to the receptor substrate;
13. Place substrates into a CCP chamber;
14. Increase global stress (or energy) of implanted region at selected depth without initiating a cleaving action (optional);
15. Provide stress (or energy) to a selected region of the bonded substrates to initiate a controlled cleaving action at the selected depth;
16. Provide additional energy to the bonded substrates to sustain the controlled cleaving action to free the thickness of silicon film from the silicon wafer;
17. Remove the detached film of material from the controlled cleaving process leaving a multi-layered substrate including films from the donor substrate and receptor substrate;
18. Place multi-layered substrate into a final bonding chamber;
19. Complete bonding;
20. Polish surface of the thickness of film on the multi-layered substrate, if necessary; and
21. Form epitaxial layer on thickness of film (optional).

The above sequence of steps provides a step of initiating a controlled cleaving action using an energy applied to a selected region(s) of a multi-layered substrate structure to form a cleave front(s) according to the present cluster tool apparatus. This initiation step begins a cleaving process in a controlled manner by limiting the amount of energy applied to the substrate. Further propagation of the cleaving action can occur by providing additional energy to selected regions of the substrate to sustain the cleaving action, or using the energy from the initiation step to provide for further propagation of the cleaving action. This sequence of steps is merely an example and should not limit the scope of the claims defined herein. Further details with regard to the above sequence of steps are described below in references to the Figs.

Figure 16:
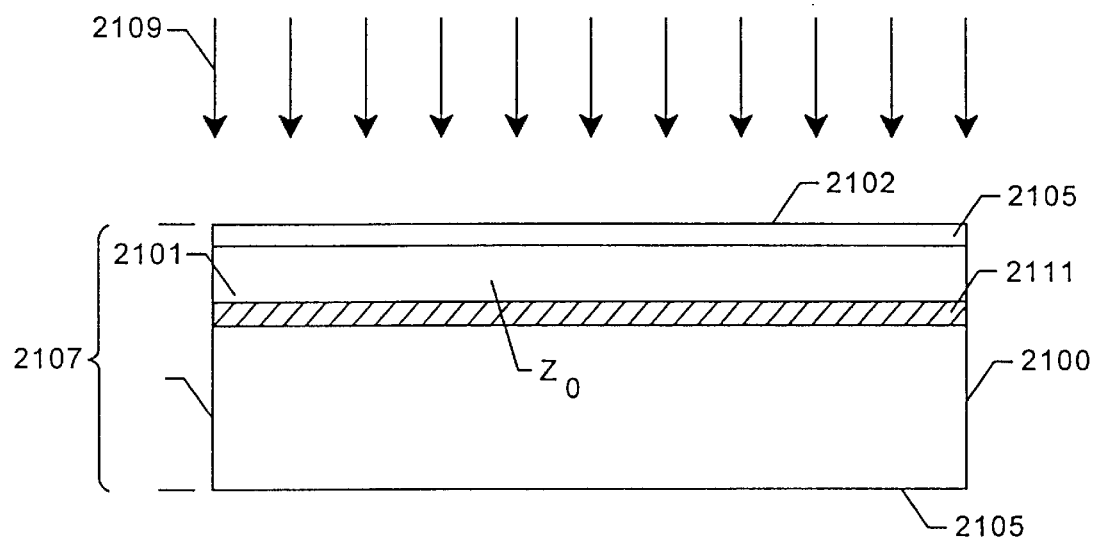
FIGS. 16–21 are simplified diagrams of an SOI process according to the present invention.

FIGS. 16–21 are simplified cross-sectional view diagrams of substrates undergoing a fabrication process for a silicon-on-insulator wafer according to the present invention. The process begins by providing a semiconductor substrate similar to the silicon wafer 2100, as shown by FIG. 16. Substrate or donor includes a material region 2101 to be removed, which is a thin relatively uniform film derived from the substrate material. The silicon wafer includes a top surface 2103, a bottom surface 2105, and a thickness 2107. Material region also includes a thickness ($z_0$), within the thickness 2107 of the silicon wafer. Optionally, a dielectric layer 2102 (e.g., silicon nitride, silicon oxide, silicon oxynitride) overlies the top surface of the substrate. The present process provides a novel technique for removing the material region 2101 using the following sequence of steps for the fabrication of a silicon-on-insulator wafer in the present cluster tool apparatus.

In a PIII chamber, selected energetic particles 2109 implant through the top surface of the silicon wafer to a selected depth, which defines the thickness of the material region, termed the thin film of material. As shown, the particles have a desired concentration 2111 at the selected depth ($z_0$). A variety of techniques can be used to implant the energetic particles into the silicon wafer. These techniques include ion implantation using, for example, beam line ion implantation equipment manufactured from companies such as Applied Materials, Eaton Corporation, Varian, and others.

Preferably, implantation occurs using a plasma immersion ion implantation technique in the PIII chamber. Of course, techniques used depend upon the application.

Depending upon the application, smaller mass particles are generally selected to reduce a possibility of damage to the material region. That is, smaller mass particles easily travel through the substrate material to the selected depth without substantially damaging the material region that the particles traversed through. For example, the smaller mass particles (or energetic particles) can be almost any charged (e.g., positive or negative) and/or neutral atoms or molecules, or electrons, or the like. In a specific embodiment, the particles can be neutral and/or charged particles including ions of hydrogen and its isotopes, rare gas ions such as helium and its isotopes, and neon. The particles can also be derived from compounds such as gases, e.g., hydrogen gas, water vapor, methane, and other hydrogen compounds, and other light atomic mass particles. Alternatively, the particles can be any combination of the above particles, and/or ions and/or molecular species and/or atomic species.

In a specific embodiment, a step of annealing the implanted target wafer occurs. In a preferred embodiment, the present invention uses a heat source to increase global energy or built-in energy of the substrate. As noted, the global energy or built-in stress is increased but does not initiate the cleaving action according to the present invention. In a specific embodiment, a silicon wafer can be separated using the present cleaving action. Before initiating the cleaving action, the wafer is heated using a heat source, e.g., furnace, hot plate, flood lamp, which can be in the PIII chamber, but also can be in another chamber such as the ones noted above. The heat source increases the temperature of the wafer to about 450 degrees Celsius and greater or about 500 degrees Celsius and greater. In most embodiments, the wafer is heated to the selected temperature, which is maintained for about one minute or less, or thirty seconds or less, or twenty seconds or less, or ten seconds or less, or a few seconds or less. The wafer is heated to increase damage to or stress to the selected implanted region without initiating the controlled cleaving action. Microbubbles may also be formed, but are not generally necessary to create damage to the selected implanted region. In the present embodiment, the heated wafer is allowed to return to room temperature, e.g., 20 degrees Celsius, before initiating a controlled cleaving action. Even though the wafer temperature is at room temperature, a substantial portion of the built-in energy remains in the wafer. The wafer can also be maintained at other temperatures. The beta annealing step also improves bonding strength between substrates, e.g., target and donor, in embodiments where annealing occurred after bonding the substrates together.

Figure 17:
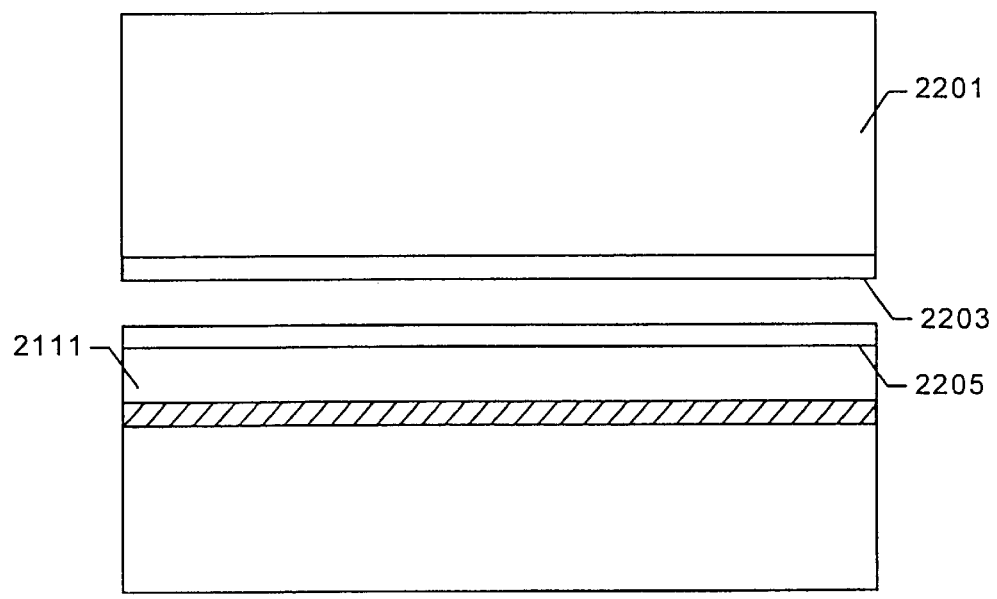

The process uses a step of joining the implanted silicon wafer to a workpiece or target wafer, as illustrated in FIG. 17. The workpiece may also be a variety of other types of substrates such as those made of a dielectric material (e.g., quartz, glass, silicon nitride, silicon dioxide), a conductive material (silicon, polysilicon, group III/V materials, metal), and plastics (e.g., polyimide-based materials). In the present example, however, the workpiece is a silicon wafer.

In a specific embodiment, the silicon wafers are joined or fused together using a low temperature thermal step in a bonding chamber. The low temperature thermal process generally ensures that the implanted particles do not place excessive stress on the material region, which can produce an uncontrolled cleave action. In one aspect, the low temperature bonding process occurs by a self-bonding process. In particular, one wafer is stripped to remove oxidation therefrom (or one wafer is not oxidized). A cleaning solution treats the surface of the wafer to form O—H bonds on the wafer surface. An example of a solution used to clean the wafer is a mixture of $H_2O_2$—$H_2SO_4$. A dryer dries the wafer surfaces to remove any residual liquids or particles from the wafer surfaces. Self-bonding occurs by placing a face of the cleaned wafer against the face of an oxidized wafer.

Preferably, a self-bonding process occurs by activating one of the wafer surfaces to be bonded by plasma cleaning in a plasma cleaning chamber. In particular, plasma cleaning activates the wafer surface using a plasma derived from gases such as argon, ammonia, neon, water vapor, and oxygen. The activated wafer surface 2203 is placed against a face of the other wafer, which has a coat of oxidation 2205 thereon. The wafers are in a sandwiched structure having exposed wafer faces. A selected amount of pressure is placed on each exposed face of the wafers to self-bond one wafer to the other.

Alternatively, an adhesive disposed on the wafer surfaces is used to bond one wafer onto the other. The adhesive includes an epoxy, polyimide-type materials, and the like. Spin-on-glass layers can be used to bond one wafer surface onto the face of another. These spin-on-glass ("SOG") materials include, among others, siloxanes or silicates, which are often mixed with alcohol-based solvents or the like. SOG can be a desirable material because of the low temperatures (e.g., 150 to 250° C.) often needed to cure the SOG after it is applied to surfaces of the wafers.

Alternatively, a variety of other low temperature techniques can be used to join the donor wafer to the target wafer. For instance, an electro-static bonding technique can be used to join the two wafers together. In particular, one or both wafer surface(s) is charged to attract to the other wafer surface. Additionally, the donor wafer can be fused to the target wafer using a variety of commonly known techniques. Of course, the technique used depends upon the application.

Figure 18:
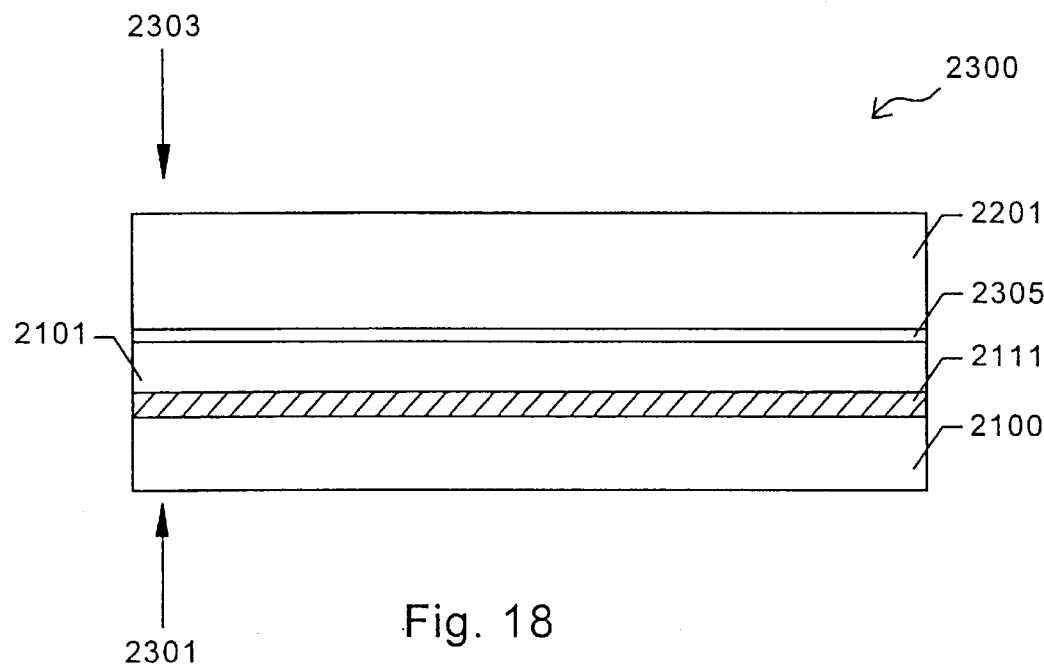

After bonding the wafers into a sandwiched structure 2300, as shown in FIG. 18, the method includes a controlled cleaving action to remove the substrate material to provide a thin film of substrate material 2101 overlying an insulator 2305 the target silicon wafer 2201. The controlled-cleaving occurs by way of selective energy placement or positioning or targeting 2301, 2303 of energy sources onto the donor and/or target wafers in a CCP chamber. For instance, an energy impulse(s) can be used to initiate the cleaving action. The impulse (or impulses) is provided using an energy source which include, among others, a mechanical source, a chemical source, a thermal sink or source, and an electrical source.

The controlled cleaving action is initiated by way of any of the previously noted techniques and others and is illustrated by way of FIG. 18. For instance, a process for initiating the controlled cleaving action uses a step of providing energy 2301, 2303 to a selected region of the substrate to initiate a controlled cleaving action at the selected depth ($z_0$) in the substrate, whereupon the cleaving action is made using a propagating cleave front to free a portion of the substrate material to be removed from the substrate. In a specific embodiment, the method uses a single impulse to begin the cleaving action, as previously noted. Alternatively, the method uses an initiation impulse, which is followed by another impulse or successive impulses to selected regions of the substrate. Alternatively, the method provides an impulse to initiate a cleaving action which is sustained by a scanned energy along the substrate.

Alternatively, energy can be scanned across selected regions of the substrate to initiate and/or sustain the controlled cleaving action.

Optionally, an energy or stress of the substrate material is increased toward an energy level necessary to initiate the cleaving action, but not enough to initiate the cleaving action before directing an impulse or multiple successive impulses to the substrate according to the present invention. The global energy state of the substrate can be raised or lowered using a variety of sources such as chemical, mechanical, thermal (sink or source), or electrical, alone or in combination. The chemical source can include particles, fluids, gases, or liquids. These sources can also include chemical reaction to increase stress in the material region. The chemical source is introduced as flood, time-varying, spatially varying, or continuous. In other embodiments, a mechanical source is derived from rotational, translational, compressional, expansional, or ultrasonic energies. The mechanical source can be introduced as flood, time-varying, spatially varying, or continuous. In further embodiments, the electrical source is selected from an applied voltage or an applied electromagnetic field, which is introduced as flood, time-varying, spatially varying, or continuous. In still further embodiments, the thermal source or sink is selected from radiation, convection, or conduction. This thermal source can be selected from, among others, a photon beam, a fluid jet, a liquid jet, a gas jet, an electro/magnetic field, a gas jet, an electron beam, a thermoelectric heating, and a furnace. The thermal sink can be selected from a fluid jet, a liquid jet, a gas jet, a cryogenic fluid, a super-cooled liquid, a thermoelectric cooling means, an electro/magnetic field, and others. Similar to the previous embodiments, the thermal source is applied as flood, time-varying, spatially varying, or continuous. Still further, any of the above embodiments can be combined or even separated, depending upon the application. Of course, the type of source used depends upon the application. As noted, the global source increases a level of energy or stress in the material region without initiating a cleaving action in the material region before providing energy to initiate the controlled cleaving action.

In a preferred embodiment, the method maintains a temperature which is below a temperature of introducing the particles into the substrate. In some embodiments, the substrate temperature is maintained between −200 and 450° C. during the step of introducing energy to initiate propagation of the cleaving action. Substrate temperature can also be maintained at a temperature below 400° C. or below 350° C. In preferred embodiments, the method uses a thermal sink to initiate and maintain the cleaving action, which occurs at conditions significantly below room temperature.

Figure 19:
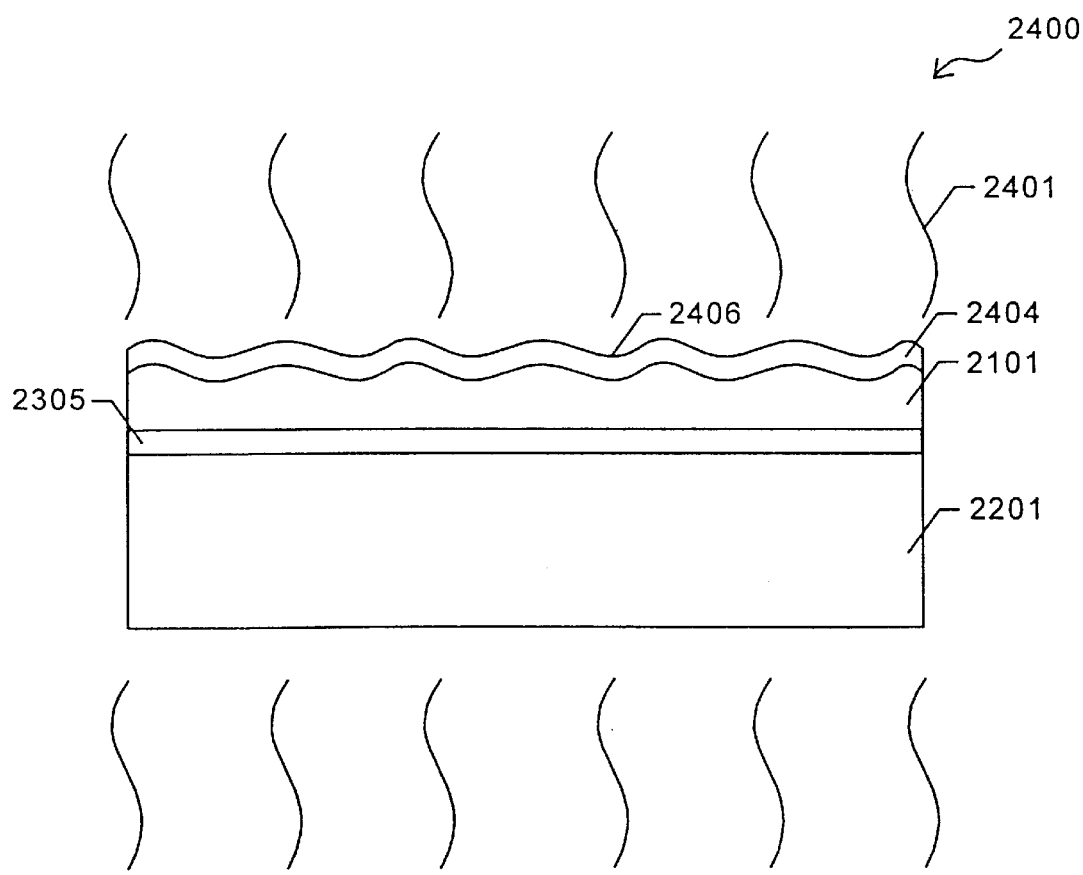

In a thermal treatment chamber, a final bonding step occurs between the target wafer and thin film of material region according to some embodiments, as illustrated by FIG. 19. In one embodiment, one silicon wafer has an overlying layer of silicon dioxide, which is thermally grown overlying the face before cleaning the thin film of material. The silicon dioxide can also be formed using a variety of other techniques, e.g., chemical vapor deposition. The silicon dioxide between the wafer surfaces fuses together thermally in this process.

In some embodiments, the oxidized silicon surface from either the target wafer or the thin film of material region (from the donor wafer) are further pressed together and are subjected to an oxidizing ambient 2401. The oxidizing ambient can be in a diffusion furnace for steam oxidation, hydrogen oxidation, or the like. A combination of the pressure and the oxidizing ambient fuses the two silicon wafers together at the oxide surface or interface 2305. These embodiments often require high temperatures (e.g., 700° C.).

Alternatively, the two silicon surfaces are further pressed together and subjected to an applied voltage between the two wafers. The applied voltage raises temperature of the wafers to induce a bonding between the wafers. This technique limits the amount of crystal defects introduced into the silicon wafers during the bonding process, since substantially no mechanical force is needed to initiate the bonding action between the wafers. Of course, the technique used depends upon the application.

After bonding the wafers, silicon-on-insulator has a target substrate with an overlying film of silicon material and a sandwiched oxide layer between the target substrate and the silicon film, as also illustrated in FIG. 19. The detached surface of the film of silicon material is often rough 2404 and needs finishing. Finishing occurs using a combination of grinding and/or polishing techniques. In some embodiments, the detached surface undergoes a step of grinding using, for examples, techniques such as rotating an abrasive material overlying the detached surface to remove any imperfections or surface roughness therefrom. A machine such as a "back grinder" made by a company called Disco may provide this technique.

Figure 20:
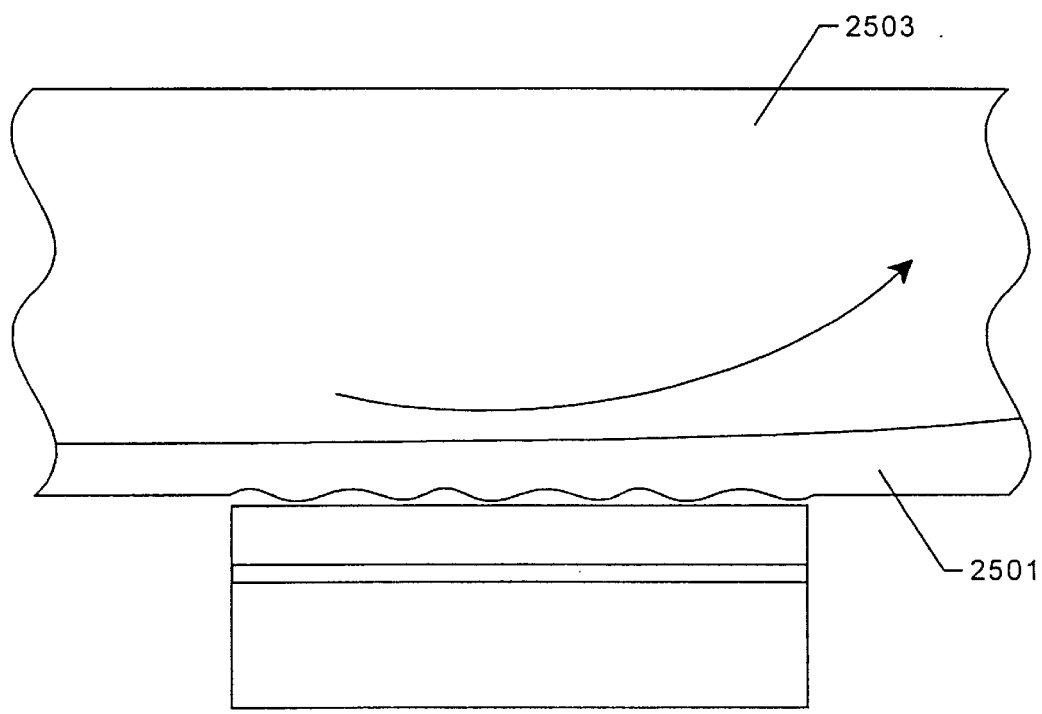

Alternatively, chemical mechanical polishing or planarization ("CMP") techniques finish the detached surface of the film, as illustrated by FIG. 20. In CMP, a slurry mixture is applied directly to a polishing surface 2501 which is attached to a rotating platen 2503. This slurry mixture can be transferred to the polishing surface by way of an orifice, which is coupled to a slurry source. The slurry is often a solution containing an abrasive and an oxidizer, e.g., $H_2O_2$, $KIO_3$, ferric nitrate. The abrasive is often a borosilicate glass, titanium dioxide, titanium nitride, aluminum oxide, aluminum trioxide, iron nitrate, cerium oxide, silicon dioxide (colloidal silica), silicon nitride, silicon carbide, graphite, diamond, and any mixtures thereof. This abrasive is mixed in a solution of deionized water and oxidizer or the like. Preferably, the solution is acidic.

Figure 21:
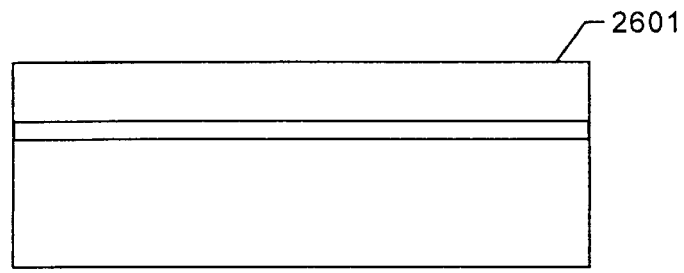

This acid solution generally interacts with the silicon material from the wafer during the polishing process. The polishing process preferably uses a polyurethane polishing pad. An example of this polishing pad is one made by Rodel and sold under the tradename of IC-1000. The polishing pad is rotated at a selected speed. A carrier head which picks up the target wafer having the film applies a selected amount of pressure on the backside of the target wafer such that a selected force is applied to the film. The polishing process removes about a selected amount of film material, which provides a relatively smooth film surface 2601 for subsequent processing, as illustrated by FIG. 21.

In certain embodiments, a thin film of oxide overlies the film of material overlying the target wafer. The oxide layer forms during the thermal annealing step, which is described above for permanently bonding the film of material to the target wafer. In these embodiments, the finishing process is selectively adjusted to first remove oxide and the film is subsequently polished to complete the process. Of course, the sequence of steps depends upon the particular application.

Although the above description is in terms of a silicon wafer, other substrates may also be used. For example, the substrate can be almost any monocrystalline, polycrystalline, or even amorphous type substrate. Additionally, the substrate can be made of III/V materials such as gallium arsenide, gallium nitride (GaN), and others. The multi-layered substrate can also be used according to the present invention. The multi-layered substrate includes a silicon-on-insulator substrate, a variety of sandwiched layers on a semiconductor substrate, and numerous other types of substrates. Additionally, the embodiments above were generally in terms of providing a pulse of energy to initiate a controlled cleaving action in a CCP chamber. The pulse can be replaced by energy that is scanned across a selected region of the substrate to initiate the controlled cleaving action. Energy can also be scanned across selected regions of the substrate to sustain or maintain the controlled cleaving action. One of ordinary skill in the art would easily recognize a variety of alternatives, modifications, and variations, which can be used according to the present invention.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A cluster tool process for forming a silicon-on-insulator substrate, said process comprising steps of:
   providing a donor substrate;
   placing said donor substrate in a first chamber and introducing particles through a surface of said donor substrate to a predetermined selected depth underneath said surface, said particles being at a concentration at said selected depth to define a portion of donor substrate material to be removed above said selected depth;
   placing said donor substrate in a second chamber and joining said donor substrate to a target substrate, said surface of said donor substrate facing a face of said target substrate to form a multi-layered substrate; and
   placing said multi-layered substrate in a third chamber, and providing energy to a selected region of said substrate to initiate a controlled cleaving action at said selected depth in said substrate, wherein said cleaving action propagates a cleave front to free said portion of donor substrate material from said substrate.

2. The process of claim 1 wherein said particles are introduced by beam line ion implantation.

3. The process of claim 1 wherein said particles are introduced by plasma immersion ion implantation.

4. The process of claim 1 wherein said particles are derived from hydrogen gas, helium gas, water vapor, methane, and hydrogen compounds, and other light atomic mass particles.

5. The process of claim 1 wherein said particles are selected from the group consisting of neutral or charged molecules or atoms, or electrons.

6. The process of claim 1 wherein said particles are energetic.

7. The process of claim 6 wherein said energetic particles have sufficient kinetic energy to penetrate through said surface to said selected depth underneath said surface.

8. The process of claim 1 wherein said energy sustains said controlled cleaving action to remove said portion of substrate material from said donor substrate to provide a film of material.

9. The process of claim 1 wherein said energy increases a controlled stress in said substrate material and sustains said controlled cleaving action to remove said portion of substrate material from said donor substrate to provide a film of material.

10. The process of claim 1 further comprising a step of providing additional energy to said donor substrate to sustain said controlled cleaving action to remove said portion of substrate material from said donor substrate to provide a film of material.

11. The process of claim 1 further comprising a step of providing additional energy to said donor substrate to increase a controlled stress in said substrate material and sustains said controlled cleaving action to remove said portion of substrate material from said donor substrate to provide a film of material.

12. The process of claim 1 wherein said particles form damage selected from the group consisting of atomic bond damage, bond substitution, weakening, or breaking bonds of said donor substrate at said selected depth.

13. The process of claim 12 wherein said damage causes stress to said substrate material.

14. The process of claim 12 wherein said damage reduces an ability of said substrate material to withstand stress without a possibility of a cleaving of said substrate material.

15. The process of claim 1 wherein said propagating cleave front is selected from a single cleave front or multiple cleave fronts.

16. The process of claim 1 wherein said particles cause stress of said substrate material at said selected depth.

17. The process of claim 1 further comprising a step of increasing an energy level of said donor substrate while substantially preventing a possibility of cleaving said substrate material at said selected depth.

18. The process of claim 17 wherein, during said step of increasing said energy level, said donor substrate is at a temperature that is below a temperature of said donor substrate during said introducing step.

19. The process of claim 1 further comprising a step of increasing a stress of said substrate while substantially preventing a possibility of cleaving said donor substrate at said selected depth.

20. The process of claim 19 wherein, during said step of increasing said stress, said donor substrate is maintained at a temperature that is below a temperature of said donor substrate during said introducing step.

21. The process of claim 17 wherein said step of increasing said energy level is performed while substantially preventing a possibility of inducing a cleaving action between said film of material and said donor substrate.

22. The process of claim 17 wherein said step of increasing said energy increases stress between said portion of said film material and said donor substrate at said selected depth while substantially preventing a possibility of inducing a cleaving action between said film of material and said donor substrate.

23. The process of claim 17 wherein said energy level is provided by a thermal source or sink, a mechanical source, a chemical source, or an electrical source.

24. The process of claim 23 wherein said chemical source is selected from particles, fluids, gases, or liquids.

25. The process of claim 23 wherein said chemical source includes a chemical reaction.

26. The process of claim 24 wherein said chemical source is selected from flood, time-varying, spatially varying, or continuous.

27. The process of claim 23 wherein said mechanical source is derived from rotational, translational, compressional, expansional, or ultrasonic.

28. The process of claim 27 wherein said mechanical source is selected from flood, time-varying, spatially varying, or continuous.

29. The process of claim 23 wherein electrical source is selected from a group consisting of an applied voltage or an applied electromagnetic field.

30. The process of claim 29 wherein said electrical source is selected from flood, time-varying, spatially varying, or continuous.

31. The process of claim 23 wherein said thermal source or sink is selected from radiation, convection, or conduction.

32. The process of claim 31 wherein said thermal source is selected from a photon beam, a fluid jet, a liquid jet, a gas jet, an electro/magnetic field, a gas jet, an electron beam, a thermo-electric heating, and a furnace.

33. The process of claim 31 wherein said thermal sink is selected from a fluid jet, a liquid jet, a gas jet, a cryogenic fluid, a super-cooled liquid, a thermoelectric cooling means, and an electro/magnetic field.

34. The process of claim 31 wherein said thermal source is selected from flood, time-varying, spatially varying, or continuous.

35. The process of claim 1 wherein said energy is a thermal source or sink, a mechanical source, a chemical source, and an electrical source.

36. The process of claim 35 wherein said chemical source is provided by particles.

37. The process of claim 35 wherein said chemical source includes a chemical reaction.

38. The process of claim 36 wherein said chemical source is flood, time-varying, spatially varying, or continuous.

39. The process of claim 35 wherein said mechanical source is derived from a group selected from rotational, translational, compressional, expansional, or ultrasonic.

40. The process of claim 39 wherein said mechanical source is selected from flood, time-varying, spatially varying, or continuous.

41. The process of claim 35 wherein electrical source is selected from an applied voltage or an applied electromagnetic means.

42. The process of claim 41 wherein said electrical source is selected from flood, time-varying, spatially varying, or continuous.

43. The process of claim 35 wherein said thermal source or sink is selected from radiation, convection, or conduction.

44. The process of claim 43 wherein said thermal source is selected from a photon beam, a liquid jet, a gas jet, an electron beam, a thermo-electric heating, and a furnace.

45. The process of claim 43 wherein said thermal sink is selected from a liquid jet, a gas jet, a cryogenic fluid, a super-cooled liquid, a thermo-electric cooling means, and a super-cooled gas.

46. The process of claim 43 wherein said thermal source is selected from flood, time-varying, spatially varying, or continuous.

47. The process of claim 1 wherein said donor substrate is maintained at a temperature ranging between −200° C. and 450° C. during said introducing step.

48. The process of claim 1 wherein said step of providing said energy is maintained at a temperature below 400° C.

49. The process of claim 1 wherein said step of providing said energy is maintained at a temperature below 350° C.

50. The process of claim 1 further comprising a step of removing said portion of substrate material.

51. The process of claim 1 further comprising a step of treating said target substrate comprising said joined substrate material to bond said substrate material to said target substrate.

52. The process of claim 51 wherein said step of treating is selected from furnace annealing, thermal annealing, and rapid thermal annealing.

53. The process of claim 51 further comprising a step of removing said substrate material to be removed from said donor substrate after said treating step.

54. The process of claim 1 wherein said joining step comprises activating said surface of said donor substrate; and joining said surface of said donor substrate to said face of said target substrate.

55. The process of claim 1 wherein said joining step comprises activating said surface of said donor substrate using a plasma process.

56. The process of claim 55 wherein said plasma process is derived from gases selected from argon, ammonia, neon, water vapor, and oxygen.

57. The process of claim 1 wherein said joining step comprises activating said surface of said donor substrate using a wet process.

58. The process of claim 57 wherein said wet process is derived from a solution of hydrogen peroxide and sulfuric acid.

59. The process of claim 1 wherein said joining step comprising activating said face of said target substrate using a plasma process.

60. The process of claim 59 wherein said plasma process is derived from gases selected from argon, ammonia, neon, water vapor, and oxygen.

61. The process of claim 1 wherein said joining step comprising activating said face of said target substrate using a wet process.

62. The process of claim 61 wherein said wet process is derived from a solution of hydrogen peroxide and sulfuric acid.

63. The process of claim 1 wherein said joining step is provided by applying an electrostatic pressure between said target substrate and said donor substrate.

64. The process of claim 1 wherein said joining step is provided by using an adhesive substance between said target substrate and said donor substrate.

65. The process of claim 1 wherein said joining step is provided by an interatomic bond between said target substrate and said donor substrate.

66. The process of claim 1 wherein said joining step is provided by a spin-on-glass between said target substrate and said donor substrate.

67. The process of claim 1 wherein said joining step is provided by a polyimide film between said target substrate and said donor substrate.

68. The process of claim 1 further comprising a step of finishing a surface of said portion of donor substrate material.

69. The process of claim 68 wherein said finishing step is a polishing step.

70. The process of claim 68 wherein said finishing step is a chemical mechanical polishing step.

71. The process of claim 1 wherein said first chamber and said second chamber are part of the same cluster tool.

72. The process of claim 1 wherein said second chamber and said third chamber are part of the same cluster tool.

73. The process of claim 1 wherein said first chamber, said second chamber and said third chambers are part of the same cluster tool.

* * * * *